United States Patent
Litsyn et al.

(10) Patent No.: US 9,887,805 B2
(45) Date of Patent: Feb. 6, 2018

(54) DEVICE, SYSTEM AND METHOD FOR EFFICIENT COSET DECODER BY TRANSFORM

(71) Applicant: Tsofun Algorithm Ltd., Tel Aviv (IL)

(72) Inventors: Simon Litsyn, Tel Aviv (IL); Noam Presman, Givatayim (IL)

(73) Assignee: Tsofun Algorithm Ltd., Tel Aviv (IL)

( * ) Notice: Subject to any disclaimer, the term of this patent is extended or adjusted under 35 U.S.C. 154(b) by 1 day.

(21) Appl. No.: 15/199,418

(22) Filed: Jun. 30, 2016

(65) Prior Publication Data

US 2018/0006767 A1    Jan. 4, 2018

(51) Int. Cl.
| | | |
|---|---|---|
| *H03M 13/00* | (2006.01) | |
| *H04L 1/00* | (2006.01) | |
| *H03M 13/45* | (2006.01) | |
| *H03M 13/37* | (2006.01) | |
| *H04N 9/804* | (2006.01) | |
| *H04N 19/60* | (2014.01) | |

(52) U.S. Cl.
CPC ...... *H04L 1/0045* (2013.01); *H03M 13/3746* (2013.01); *H03M 13/45* (2013.01); *H04L 1/0047* (2013.01); *H04L 1/0057* (2013.01); *H04N 9/8047* (2013.01); *H04N 19/60* (2014.11)

(58) Field of Classification Search
CPC ... H04L 1/0045; H04L 1/0059; H04L 1/0047; H03M 13/3746; H03M 13/45; H03M 13/458; H04N 9/80; H04N 9/8047; H04N 19/60; H04N 19/00

See application file for complete search history.

(56) References Cited

U.S. PATENT DOCUMENTS

| 8,073,052 B1 * | 12/2011 | Xu | H03M 7/30 |
|---|---|---|---|
| | | | 375/240.03 |
| 2003/0081691 A1 * | 5/2003 | Sutskover | H03M 5/20 |
| | | | 375/286 |
| 2006/0048038 A1 * | 3/2006 | Yedidia | H03M 7/30 |
| | | | 714/793 |

OTHER PUBLICATIONS

E. Arikan, "Channel Polarization: A Method for Constructing Capacity-Achieving Codes for Symmetric Binary-Input Memoryless Channels," IEEE Transactions on Information Theory, vol. 55, No. 7, Jul. 2009, pp. 3051-3073.

* cited by examiner

*Primary Examiner* — Christine Tu
(74) *Attorney, Agent, or Firm* — Pearl Cohen Zedek Latzer Baratz LLP

(57) ABSTRACT

A device, system and method for decoding. A noisy version of an error correction codeword may be received, for example, over a noisy communication channel or retrieved from a memory device (e.g. a flash memory device). One or more symbol probabilities may be transformed, from an initial domain to a transformed domain, the symbol probabilities being one or more individual symbols of the received error correction codeword were transmitted as one or more symbols in candidate transmitted error correction codewords. In the transformed domain, a plurality of the transformed symbol probabilities may be composed to generate a combined coset probability defining the likelihood that the transmitted error correction codeword is associated with the individual symbols belongs to a particular one of a plurality of candidate cosets. A plurality of the coset probabilities for the plurality of respective cosets may be inverse transformed from the transformed domain to the initial domain.

26 Claims, 16 Drawing Sheets

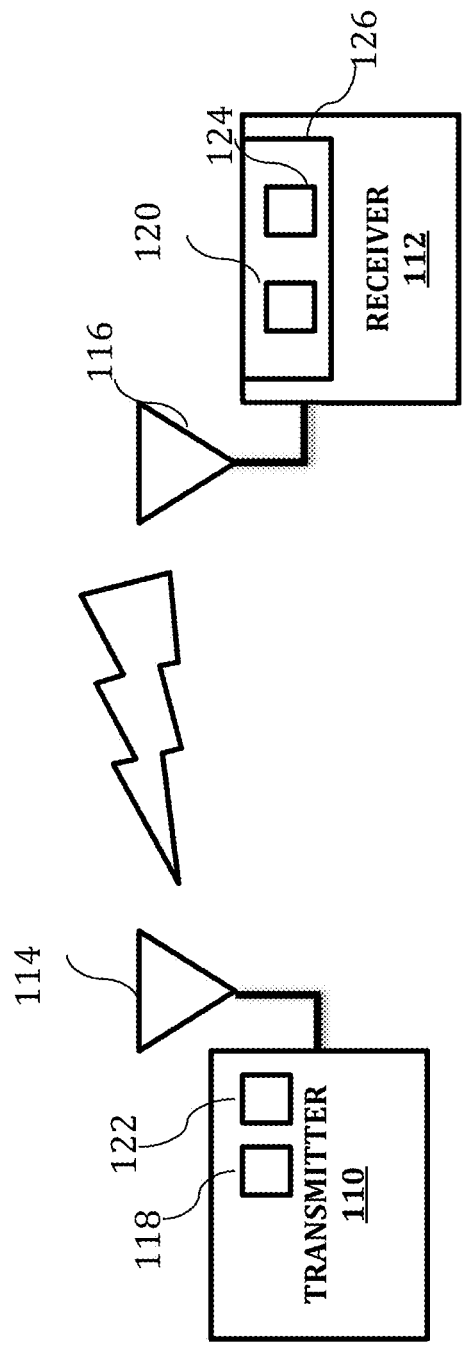

201 → $f(b_0^{m-1}) : ([p]_-)^m \to \mathbb{C}$

202 → $F(\omega_0^{m-1}) : ([p]_-)^m \to \mathbb{C}$   $p$ is a prime number

203 → $F(\omega_0^{m-1}) = \sum_{b_0^{m-1} \in ([p]_-)^m} f(b) \cdot e^{-\frac{2\pi i}{p}(\omega \cdot b^T)}$   $i \triangleq \sqrt{-1}$ 204 → $\sum_{\omega_0^{m-1} \in ([p]_-)^m} e^{\frac{2\pi i}{p}(\omega \cdot b^T)} \cdot e^{-\frac{2\pi i}{p}(\omega \cdot b'^T)} = p^m \cdot \delta_{b,b'}$ 205 → $f(b) = \frac{1}{p^m} \cdot \sum_{\omega_0^{m-1} \in ([p]_-)^m} F(\omega) \cdot e^{\frac{2\pi i}{p}(\omega \cdot b^T)}$ 206 → $g(b) = \sum_{b' \in ([p]_-)^m} f_1(b - b') f_2(b') \Leftrightarrow G(\omega) = F_1(\omega) F_2(\omega)$ 207 → $g(b) = f(b \cdot \Gamma) \Leftrightarrow G(\omega) = F(\omega \cdot (\Gamma^{-1})^T),\ b, \omega \in ([p]_-)^m, \Gamma \in ([p]_-)^{m \times m}, invertible$ 208 → $g(b) = \begin{cases} f(\tilde{b}) & b = \tilde{b} \cdot \Gamma \\ 0 & o.w \end{cases} \Leftrightarrow G(\omega) = F(\omega \cdot \Gamma^T),\ b, \omega \in ([p]_-)^m,$ $\tilde{b} \in ([p]_-)^\ell, \Gamma \in ([p]_-)^{\ell \times m}$ full rank, $\ell \leq m$.

FIG. 2

$$301 \searrow F(\boldsymbol{\omega}_0^{m-1}) = \sum_{\boldsymbol{b}_0^{m-1} \in ([p]_-)^m} f(\boldsymbol{b}) \cdot e^{\frac{2\pi \mathrm{i}}{p}(\boldsymbol{\omega} \cdot \boldsymbol{b}^T)} = \sum_{b_0 \in [p]_-} F^{(b_0)}(\boldsymbol{\omega}_1^{m-1}) \cdot e^{-\frac{2\pi \mathrm{i}}{p} \omega_0 \cdot b_0}$$

$$= \mathcal{HT}\left(F^{(b)}(\boldsymbol{\omega}_1^{m-1})\right)\big|_{\omega = \omega_0}$$

$$302 \searrow F^{(b)}(\boldsymbol{\omega}_1^{m-1}) = \sum_{\boldsymbol{b}_1^{m-1} \in ([p]_-)^{m-1}} f([b\ \boldsymbol{b}_1^{m-1}]) e^{\frac{2\pi \mathrm{i}}{p} \omega_1^{m-1} \cdot (\boldsymbol{b}_1^{m-1})^T}$$

$$303 \searrow \mathcal{HT}(g(b)) = \sum_{b \in [p]_-} g(b) e^{\frac{2\pi \mathrm{i}}{p} \omega b}$$

FIG. 3

$401 \rightarrow f(\boldsymbol{b}_0^{m-1}): \{0,1\}^m \rightarrow \mathbb{R}$ $402 \rightarrow F(\boldsymbol{\omega}_0^{m-1}): \{0,1\}^m \rightarrow \mathbb{R}$ $403 \rightarrow F(\boldsymbol{\omega}_0^{m-1}) = \sum_{\boldsymbol{b}_0^{m-1} \in \{0,1\}^m} f(\boldsymbol{b}) \cdot (-1)^{\boldsymbol{\omega} \cdot \boldsymbol{b}^T}$ $404 \rightarrow \sum_{\boldsymbol{\omega}_0^{m-1} \in \{0,1\}^m} (-1)^{\boldsymbol{\omega} \cdot \boldsymbol{b}^T} \cdot (-1)^{\boldsymbol{\omega} \cdot \boldsymbol{b}'^T} = 2^m \cdot \delta_{b,b'}$ $405 \rightarrow f(\boldsymbol{b}) = \frac{1}{2^m} \cdot \sum_{\boldsymbol{\omega}_0^{m-1} \in \{0,1\}^m} F(\boldsymbol{\omega}) \cdot (-1)^{\boldsymbol{\omega} \cdot \boldsymbol{b}^T}$

FIG. 4 until the number of candidate error correction codewords in a final coset generated in a final iteration is below a threshold number and/or until a duration of time estimated for decoding the candidate error correction codewords in a final coset generated in a final iteration is below a threshold duration of time.

For sequential maximum likelihood codeword decoding, after maximum likelihood coset decoding or its sequential version are executed to select a most likely coset of codewords, executing a maximum likelihood codeword criterion on the selected coset in order to determine a most likely transmitted error correction codeword in the most likely coset that has a maximum likelihood codeword criteria value.

In one embodiment, multiple decoder circuits may be performed, in series, wherein the output of a first of the multiple decoder circuits is sent in the transformed domain, without inverse transforming the output, to a second of the multiple decoder circuits. For polar code decoding, the multiple decoder circuits may generate multiple coset probabilities for multiple kernels of the polar code, respectively, and the multiple coset probabilities may be combined to generate a combined coset probability for the entire polar code.

Some embodiments of the invention describe methods and apparatuses for an efficient sequential coset decoder that reduces power, hardware implementation chip area, and time of computation. Those methods and apparatuses may perform a transformation of an input to the coset decoder into a transformed domain that allows fast processing of the coset decoder. The inverse transform may be applied in order to retrieve a likelihood value of each coset, which may be used to select the most likely coset. The sequential coset decoder may execute a plurality of sequential iterations in the transformed domain. In each iteration, a most likely coset may be selected from a plurality of possible candidate cosets. The complexity of the coset maximum likelihood (ML) computations is significantly reduced in the transformed domain, thus increasing the speed and efficiency of each iteration of the sequential coset decoder. The sequential coset decoder may iterate a number of times, each iteration reducing the size of the selected coset, e.g., until the coset selected in a final iteration is sufficiently small, e.g., containing a below threshold number of codewords, such that, examining each one of its members can be performed in an acceptable or below threshold amount of time. Embodiments of the invention may then revert to codeword decoding of the codewords contained in the final coset, e.g., individually analyzing all of the codewords in the final coset to determine the codeword that is most likely equal to the transmitted codeword. The codeword decoder may decode the received signal codeword fast and efficiently by analyzing only codewords in the reduced coset, instead of all codewords in the original code field.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 1A is a schematic illustration of a communication system comprising a coset maximum likelihood decoder operating according to an embodiment of the invention;

FIG. 2 provides an example Hadamard transform and associated properties used according to an embodiment of the invention;

FIG. 3 provides an example fast Hadamard transform (FHT) and associated properties used according to an embodiment of the invention;

FIG. 4 provides an example transform operating over a binary space for functions defined over the real numbers, $\mathbb{R}$, , according to an embodiment of the invention;

Figure 1B:
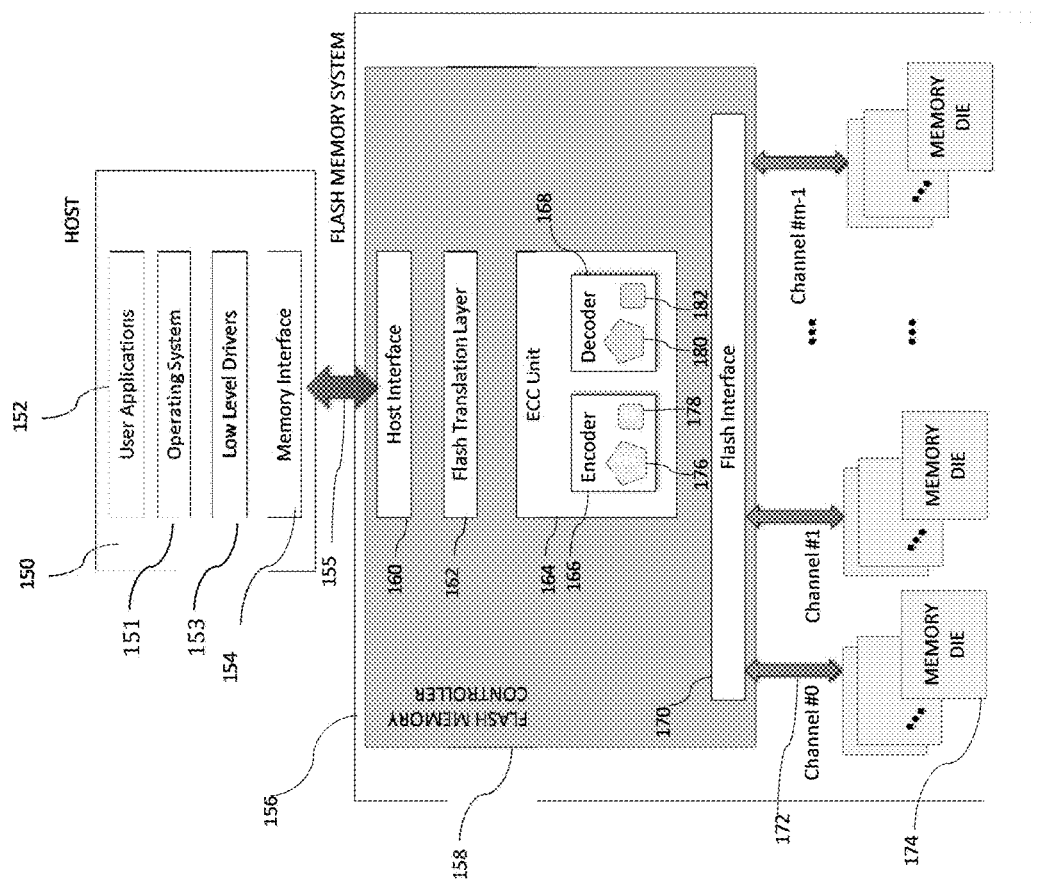
FIG. 1B is a schematic illustration of a memory system comprising a coset maximum likelihood decoder operating according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF EMBODIMENTS OF THE INVENTION

Error Correcting Codes (ECC) may be used to mitigate noisy channels in communications. An optimal decoder may minimize an output block error rate by using maximum likelihood (ML) criterion (e.g., equations (1)-(2)). However, in many cases, implementing such maximum likelihood (ML) criterion is prohibitive because of the high complexity of the ML computations required to examine all possible candidate codewords in the codebook.

According to embodiments of the invention, a sequential decoder may implement a multi-step decoding process, where, in each step, the decoder may reduce the number of possible or candidate codewords to be evaluated for the ML criteria. A sequential coset decoder exploits the property that the ML candidate codewords in each sequential step i is always an element of a coset of the code of ML candidate codewords of the previous step i−1. Cosets may be mutually exclusive (non-overlapping) subsets of a code including different codewords from a codebook of all possible error correction codewords. Each coset may include a distinct set of codewords, where the union of all cosets of the code is equal to the code and includes all possible codewords in the code. In one example, a coset may define a subset of the codebook or possible codewords set that is an affine linear space (described by a translation of a linear space by a constant vector). For example, the set of all binary vectors of length n with an even number of ones and the set of all binary vectors of length n with an odd number of ones are two cosets of the set of binary vectors. Example sequential coset decoders may be used for applications, such as, successive cancellation (SC) and belief propagation (BP), employed on general concatenated codes such as polar codes.

In each step, sequential coset decoders may select the most likely coset from the set of possible coset candidates based on one or more maximum likelihood criteria (e.g., equations (3)-(7)). For example, sequential coset decoders may calculate, for each coset, a numerical value or likelihood score and select the coset with the highest value. Embodiments of the invention may provide methods and apparatuses for efficient implementation of sequential coset decoders that reduce power, area and time of computations. These apparatuses and methods may be used in a variety of applications, including, for example, mobile applications, memory applications, and other suitable applications.

A method and apparatus according to embodiments of the present invention is provided having an efficient implementation of coset decoding based on a transformation of the input likelihoods into an isomorphic structure that allows fast processing, for example, of coset likelihoods (e.g., equations (8)-(11)). After this processing is performed an inverse transform may retrieve the results in the required format (e.g., equation (13)-(14)). Using this format the most probable coset may be selected according (e.g. according to equation (3)).

According to some embodiments of the present invention, multiple coset decoders or circuits may be used, for example, in series, where the output of a first coset decoder circuit is an input to a second coset decoder circuit. Thus, the coset likelihood processing of the first coset decoder circuit is an intermediate step in a calculation that is provided to the additional second coset decoder circuit. In such embodiments, the likelihood data output from the first coset decoder circuit may remain in the transform space and the inverse transform operation may be eliminated so the input to the second coset decoder circuit includes the processed results of the transformed input. Transform space results may continue to be iteratively transferred to an additional one or more circuits, for example, until the likelihood values of cosets is needed, in which case an inverse transform may be performed.

Various transformations may be used according to embodiments of the present invention. The transformation may include an isomorphic transformation (e.g., an invertible transformation in which the transformed elements are equivalent under isomorphism), a bijective transformation (e.g., a one-to-one correspondence between elements of the transformed domain and the initial domain), a Fourier transform, a fast Fourier transform, a Hadamard transform, a fast Hadamard transform, or any transform in which a convolution operation in the original domain is simplified in the transform domain. Further embodiments of the present invention may perform a log of the above transformations to operate in the log domain, such that the input to the decoder is the logarithm of the likelihood and a log of the transform is calculated. Other transformations may be used.

The following notations and conventions are used herein. For any natural number l, the term $[l]_-$ may denote the set of size l, $\{0, 1, 2, \ldots, l-1\}$. Vectors may be denoted by bold letters and random variables may be denoted by capital letters (e.g., random vectors may be denoted by bold uppercase letters). For $j \leq i$, $u_j^i = [u_j, u_{j+1}, \ldots, u_i]$ may denote a sub-vector of vector u of length i−j+1 (if i<j, then $u_j^i = [\ ]$, the empty vector, and its length is 0). Vectors described herein are assumed to be row-vectors, although column vectors, sequences, or other data structures may be used. Column vectors are generated from row vectors u by the transpose operation, $u^T$.

Given a set of possible symbol values F, an error correction code (ECC) (denoted as C) of length n symbols may be a subset of an n-dimensional field $F^n$. The rate of C may be defined, for example, as $$R = \frac{\log_2 |C|}{n \cdot \log_2 |F|},$$

based on the size or magnitude of the code |C|, the size of the field |F| and the length of the code n. For example, as the codeword length n increases, the rate R decreases and the speed decreases for communicating or transferring information. If the set of possible signal values F is a field and C is a linear space in $F^n$, C is a linear code over F. Such a code C may be defined, in one example, by a generating matrix B having, e.g., k=R·n rows and n columns, such that $C = \{v \cdot B | v \in F^k\}$. The parameter k may denote the code dimension, e.g., such that $|C| = |F|^k$ (the code dimension k is equal to the base |F| logarithm of the size of the code). A dual space of a linear code C may be denoted as $C^\perp$ and may be defined as a plurality of all vectors in $F^n$ that are orthogonal to all the codewords in C. Thus, the dual space $C^\perp$ is orthogonal to its code space C such that any codeword $c^\perp \in C^\perp$ is orthogonal to any codeword $c \in C$, e.g., $c^\perp \cdot c = 0$. Codewords $c^\perp$ of the dual space $C^\perp$ may be generated by a dual space generating matrix H (e.g., a parity check matrix of C) that may have, for example, n columns and n−k rows, such that $c \in C$ if and only if $c \cdot H^T = 0$. A syndrome s of a length n vector v may be defined, for example, as $s = v \cdot H^T$. Thus, the syndrome of codewords $c \in C$ is, for example, zero. A syndrome may measure the result of applying the parity check equations (e.g., columns of H) to the values of a codeword v. When all the parity check equations are satisfied (e.g., $v \cdot H^T$ is equal to the zero vector), then codeword v is a codeword in C.

Consider a channel carrying signals x→y in which a signal x∈X is transmitted using a transmitter over the channel and a noisy version of the signal y∈𝒴 is received at a receiver. The channel may be "memoryless," meaning that the channel noise at one time for one transmission $x_i \rightarrow y_i$ is independent of the channel noise at another time for another transmission $x_j \rightarrow y_j$. A maximum likelihood (ML) codeword decoder may determine for each received channel observation vector y, the most probable transmitted codeword x, for example, by maximizing the following likelihood:

$$\Pr(Y_0^{n-1} = y_0^{n-1} | X_0^{n-1} = x_0^{n-1}) = \prod_{j=0}^{n-1} \Pr(Y_j = y_j | X_j = x_j) \quad (1).$$

This likelihood defines the probability or likelihood of receiving a channel observation vector y if a codeword x is sent over the channel. The maximum likelihood codeword decoder may be defined, for example, as:

$$\hat{x} = \operatorname{argmax}_{x_0^{n-1} \in C} \Pr(Y_0^{n-1} = y_0^{n-1} | X_0^{n-1} = x_0^{n-1}) \quad (2)$$

to detect the transmitted codeword $\hat{x} = x_0^{n-1} \in C$ that maximizes this probability, e.g., equation (1). If each codeword in an ECC C is sent over the channel with same probability (e.g., the system has no preference or bias for certain codewords over others, such as preferring 0's over 1's in a binary system), then this maximum likelihood criterion corresponds to a minimum block error probability $\Pr(\hat{X} \neq X)$ defining a minimum probability of error that the estimated codeword $\hat{x}$ is incorrect. If codewords in an ECC C are transmitted with bias, then the maximum likelihood criterion above may be replaced with $\Pr(Y_0^{n-1} = y_0^{n-1} | X_0^{n-1} = x_0^{n-1}) \Pr(X_0^{n-1} = x_0^{n-1})$ to take the preference into account. In such a case, the criterion may be referred to as the maximum posteriori probability (MAP) criterion.

According to some embodiments of the invention, $C^{(1)}$ and $C^{(2)}$ may be two linear codes in a space $F^n$. $C^{(1)}$ may be a set of all possible codewords of length n and may contain $C^{(2)}$, for example, $C^{(2)} \subseteq C^{(1)}$, where $C^{(2)}$ may be referred to as a sub-code of $C^{(1)}$. $k_1$ and $k_2$ may be used to denote the code dimensions of $C^{(1)}$ and $C^{(2)}$, respectively. $\lambda$ may be used to denote a codeword $\lambda \in C^{(1)}$. A coset of $C^{(2)}$ in $C^{(1)}$ induced by codeword $\lambda$ may be defined, for example, as $\{\lambda + c | c \in C^{(2)}\}$. This coset may be denoted as $\lambda + C^{(2)}$ or $C^{(2)} + \lambda$. Because linear spaces are closed under addition, and both codeword $\lambda$ and sub-code $C^{(2)}$ are contained in $C^{(1)}$, their sum, coset $\lambda + C^{(2)}$, is also contained in $C^{(1)}$, for example, $\lambda + C^{(2)} \subseteq C^{(1)}$. Since $C^{(1)}$ has $|F|^{k_1}$ elements and $C^{(2)}$ has $|F|^{k_2}$ elements, according to the Lagrange theorem, the cosets of $C^{(2)}$ partition $C^{(1)}$ into $$\frac{|C^{(1)}|}{|C^{(2)}|}$$

distinct codeword subsets. Furthermore, all the vectors in the same coset have the same syndrome. In other words, if $x \in \lambda + C^{(2)}$, $w \in F^n$ and H is a parity check matrix of $C^{(2)}$, then $x \cdot H^T = w \cdot H^T$ if and only if $w \in \lambda + C^{(2)}$.

Embodiments of the invention may exploit this syndrome equivalence to identify cosets and thus reduce the maximum likelihood codeword decoder to operate over a smaller coset of the code. This may reduce the relatively high number of computations associated with computing probabilities for all codewords in $C^{(1)}$ (in maximum likelihood codeword decoding) to a relatively smaller number of computations associated with computing probabilities for the relatively fewer codewords in the maximum likelihood coset of $C^{(2)}$ in $C^{(1)}$ (in maximum likelihood coset decoding), thereby reducing computational effort and increasing decoding efficiency. Whereas the maximum likelihood codeword decoder detects the exact codeword that was transmitted, the maximum likelihood coset decoder detects the coset in $C^{(2)}$ to which the transmitted codeword belongs. Let $C^{(1)}/C^{(2)}$ be the set of cosets of $C^{(2)}$ in $C^{(1)}$ also known as the factor group of $C^{(2)}$ in $C^{(1)}$. The maximum likelihood coset decoder may be defined, for example, as:

$$\hat{A} = \operatorname{argmax}_{A \in C^{(1)}/C^{(2)}} \sum_{x_0^{n-1} \in A} \Pr(Y_0^{n-1} = y_0^{n-1} | X_0^{n-1} = x_0^{n-1}). \quad (3)$$

In case the channel is memoryless, the maximum likelihood coset decoder of equation (3) requires $$|C^{(1)}| - \frac{|C^{(1)}|}{|C^{(2)}|} = |F|^{k_1} - |F|^{k_1 - k_2}$$

additions and $|C^{(1)}| \cdot (n-1) = |F|^{k_1}(n-1)$ multiplications. An alternative to computing equation (3) may be derived using a parity check matrix of $C^{(2)}$, denoted as H. Let S be the set of syndromes corresponding to cosets of $C^{(2)}$ in $C^{(1)}$, e.g., $S = \{s | s = x \cdot H^T, x \in C^{(1)}\}$. This results in the following equation:

$$\sum_{x \text{ s.t. } H \cdot x^T = s} \prod_{i=0}^{n-1} \Pr(Y_i = y_i | X_i = x_i) = \quad (4)$$

$$\sum_{x_{n-1} \in F} \Pr(Y_{n-1} = y_{n-1} | X_{n-1} = x_{n-1})$$

$$\left( \sum_{\substack{x_0^{n-2} \text{ s.t.} \\ x_0^{n-2} \cdot (H^{[n-2]})^T = s - x_{n-1} \cdot (H_{n-1})^T}} \prod_{j=0}^{n-2} \Pr(Y_j = y_j | X_j = x_j) \right),$$

where $H_j$ is the $j^{th}$ column in the matrix H, and $H^{[j]}$ is the matrix that contains columns 0 ... j of H. Using the notation, $g_j(s) = \Pr(Y_j = y_j | X_j = x_j)$ if there exists $x_j \in F$ such that $s = x_j \cdot (H_j)^T$; otherwise $g_j(s) = 0$. Further denoting, $$g^{(j)}(s) = \sum_{\substack{x_0^j \text{ s.t.} \\ x_0^j \cdot (H^{[j]})^T = s}} \prod_{i=0}^{j} \Pr(Y_i = y_i | X_i = x_i),$$

results in:

$$g^{(n-1)}(s) = \Sigma_{x \text{ s.t. } x \cdot H^T = s} \Pi_{i=0}^{n-1} \Pr(Y_i = y_i | X_i = x_i) = \Sigma_{s' \in F^{n-k}}$$
$$g_{(n-1)}(s') \cdot g^{(n-2)}(s-s') \quad (5).$$

Equation (5) represents the maximum likelihood coset criterion as a convolution operation, e.g., between $g^{(n-2)}(\bullet)$ and $g_{(n-1)}(\bullet)$, denoted as $g_{(n-1)} * g^{(n-2)}$, where, $$g^{(n-1)} = g_0 * g_1 * g_2 * \ldots * g_{n-1} \quad (6).$$

To calculate $g^{(n-1)}(s)$ for all syndromes $s \in F^{n-k_2}$, at most $(n-1) \cdot |F|^{n-k_2}(|F|-1)$ addition and $(n-1)|F|^{n-k_2+1}$ multiplications may be executed using cosets of $C^{(2)}$. This upper-bound is not tight since not all the syndromes of cosets of $C^{(2)}$ are of considered, rather than only those that are also in $C^{(1)}$. Careful analysis results in smaller number of calculations (dependent of $C^{(1)}$ and $C^{(2)}$). In any case the complexity is not higher than $|F|^{k_1} - |F|^{k_1 - k_2}$ additions and $|C^{(1)}| \cdot (n-1) = |F|^{k_1} \cdot (n-1)$ used to compute equation (3) above.

Coset decoders shrink the target set of candidate codewords from an initial relatively large code $C^{(1)}$ to a smaller coset $\lambda + C^{(2)}$ partition of $C^{(1)}$, thereby reducing the number of maximum likelihood computations used to evaluate the target codewords. This reduction may be sequentially repeated multiple times to iteratively reduce or narrow the size of the target coset and the associated number of maximum likelihood computations using a "sequential codeword decoder."

Sequential codeword decoders contain a plurality of sequential decoding steps such that, in each step, the size or number of candidates in each coset is decreased. Let $C^{(1)}$, $C^{(2)}$, ..., $C^{(m)}$ be a chain of nested linear codes such that $C^{(i+1)}$ is a sub-code of $C^{(i)}$, for $i=1, 2, \ldots, m-1$. A codeword sequential decoder for $C^{(1)}$, induced by this chain of nesting may be defined, for example, as follows:

Step (i): A codeword $\hat{\lambda}^{(i)}$ may be received as an output of a previous step (i−1), for example, where i≥2, and $\hat{\lambda}^{(1)}=0$. A codeword from the coset $\hat{\lambda}^{(i)}+C^{(i)}$ may be used to determine a next sequential coset $\hat{\lambda}^{(i+1)}+C^{(i+1)}$, for example, using the following maximum likelihood sequential coset decoder criterion:

$$\hat{A} = \operatorname{argmax}_{A \in C^{(i)}/C^{(i+1)}} \sum_{x_0^{n-1} \in A} Pr(Y_0^{n-1} = y_0^{n-1} \mid X_0^{n-1} = x_0^{n-1} + \hat{\lambda}^{(i)}), \quad (7)$$

where $\hat{\lambda}^{(i+1)}$ may be selected such that $\hat{\lambda}^{(i+1)}+C^{(i+1)}=\hat{\lambda}^{(i)}+\hat{A}$.

Step (i) may be repeated sequentially, e.g., for 1≤i≤m−2, for some integer m. In each sequential step (i), the input coset $\hat{\lambda}^{(i)}+C^{(i)}$ may be reduced to a relatively smaller coset $\hat{\lambda}^{(i+1)}+C^{(i+1)}$. In each step (i) of the sequential decoder, the size of the coset may decrease, e.g., by a multiplicative factor of $$\frac{|C^{(i)}|}{|C^{(i+1)}|},$$

and the number of maximum likelihood coset computations may also decrease, e.g., by the same factor. At a certain iteration, the size of the final coset $\hat{\lambda}^{(m)}+C^{(m)}$ may be sufficiently small that the computational effort required for ML codeword decoding (computing individual likelihoods for all candidate codewords in the coset) is minimal, reduced, or below threshold, thereby outweighing the benefit of further reducing the coset. The step (i) iteration may stop and the process may proceed to step (m), for example, when the size of the final coset $\hat{\lambda}^{(m)}+C^{(m)}$ is sufficiently small or below threshold, the number of computations used for ML codeword decoding is sufficiently small or below threshold, and/or the time estimated for executing codeword decoding is a sufficiently small or below threshold (e.g., to allow real-time decoding applications such as communications). In one example, the decoder may switch from sequential coset decoding (step (i)) to codeword decoding (step (m)) when the number of codeword decoding computations is less than or equal to the number of coset decoding computations (or a fraction or multiple thereof).

Step (m) may perform codeword ML decoding on coset $\hat{\lambda}^{(m)}+C^{(m)}$. Because the coset $\hat{\lambda}^{(m)}+C^{(m)}$ has a sufficiently small number of codewords, this ML codeword computation may be executed quickly and efficiently. In some examples, the number of codewords in a sufficiently small coset and the number of computations required in step m may vary, e.g., 10, 100, 1000, but is generally fewer than 1,000-10,000. In other examples, other threshold numbers of codewords or steps may be used.

Examples of codes decoded using coset ML decoders may include general concatenated codes (GCC) ECCs and general polar codes. General concatenated codes (GCC) ECCs are an example in which coset decoders may be applied on inner-codes. General polar codes are a sub-ensemble of the GCC in which concatenation is recursive, e.g., the outer-codes themselves are GCCs. As such, decoding operations for polar codes, e.g. successive cancellation (SC) and belief propagation (BP), may include coset ML decoders as sub-operations within the decoding process. These example codes and operations are not intended to be limiting.

Some embodiments of the invention may operate in the log domain. In such embodiments, the above likelihoods or probabilities may be measured in the log domain, for example, using log-likelihoods (LLs) such as $\log_2(Pr(Y=y|X=x))$ or normalized versions thereof such as log-likelihood ratios (LLRs). The above calculations may also be performed in the log domain, which may in some cases improve numerical stability. In such embodiments, multiplication in equation (5) may be replaced by log-likelihood additions; additions in equation (5) may be performed in the log domain using a max*(•,•) operator, e.g., where max*(α, β)=max(α, β)+$\log_2(1+2^{-|\alpha-\beta|})$.

Figure 5:
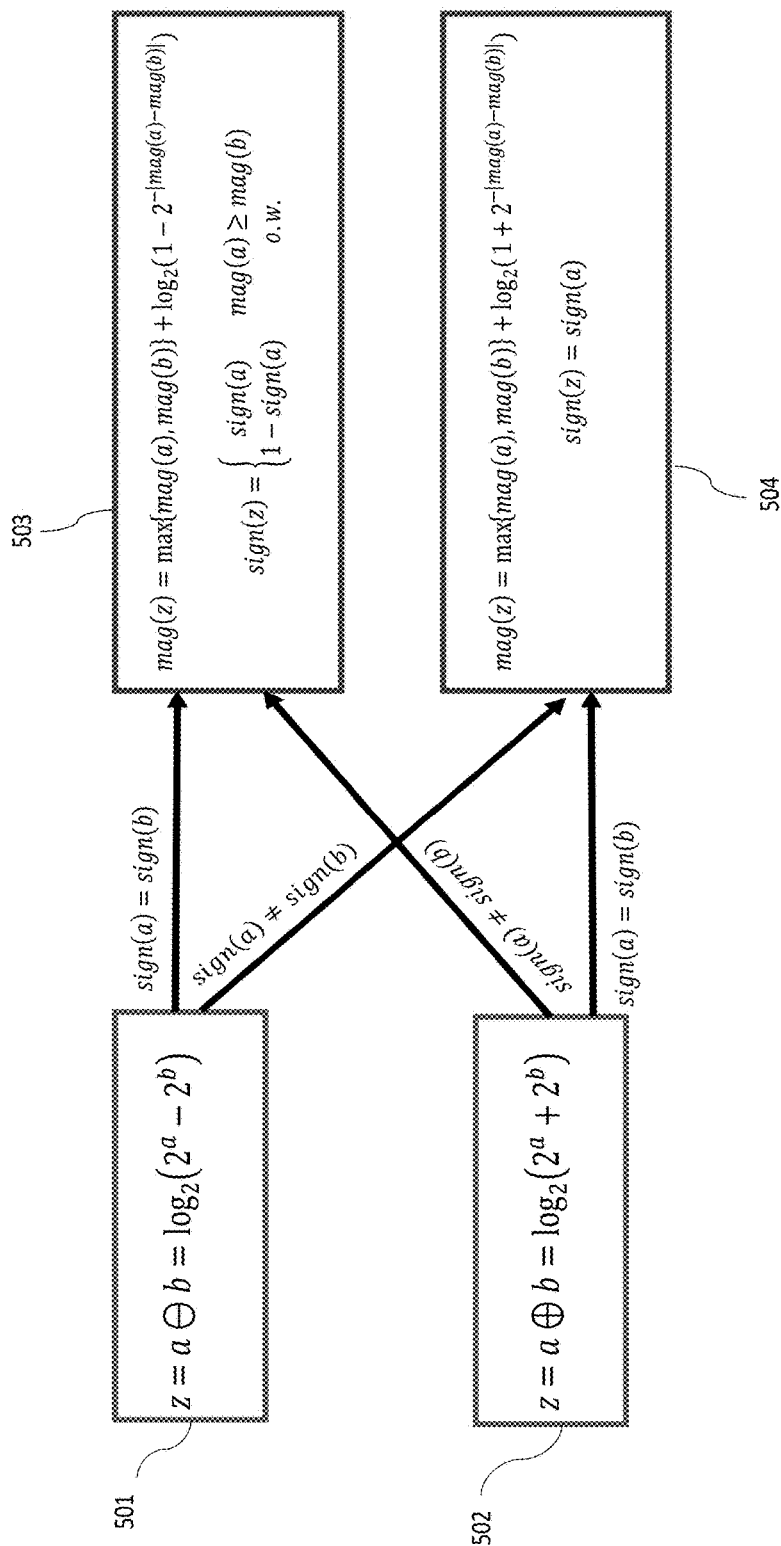
FIG. 5 schematically illustrates logical operations (e.g., software) or a circuit diagram (e.g., hardware) for performing operations $\oplus$ and $\ominus$ according to an embodiment of the invention.
Figure 6:
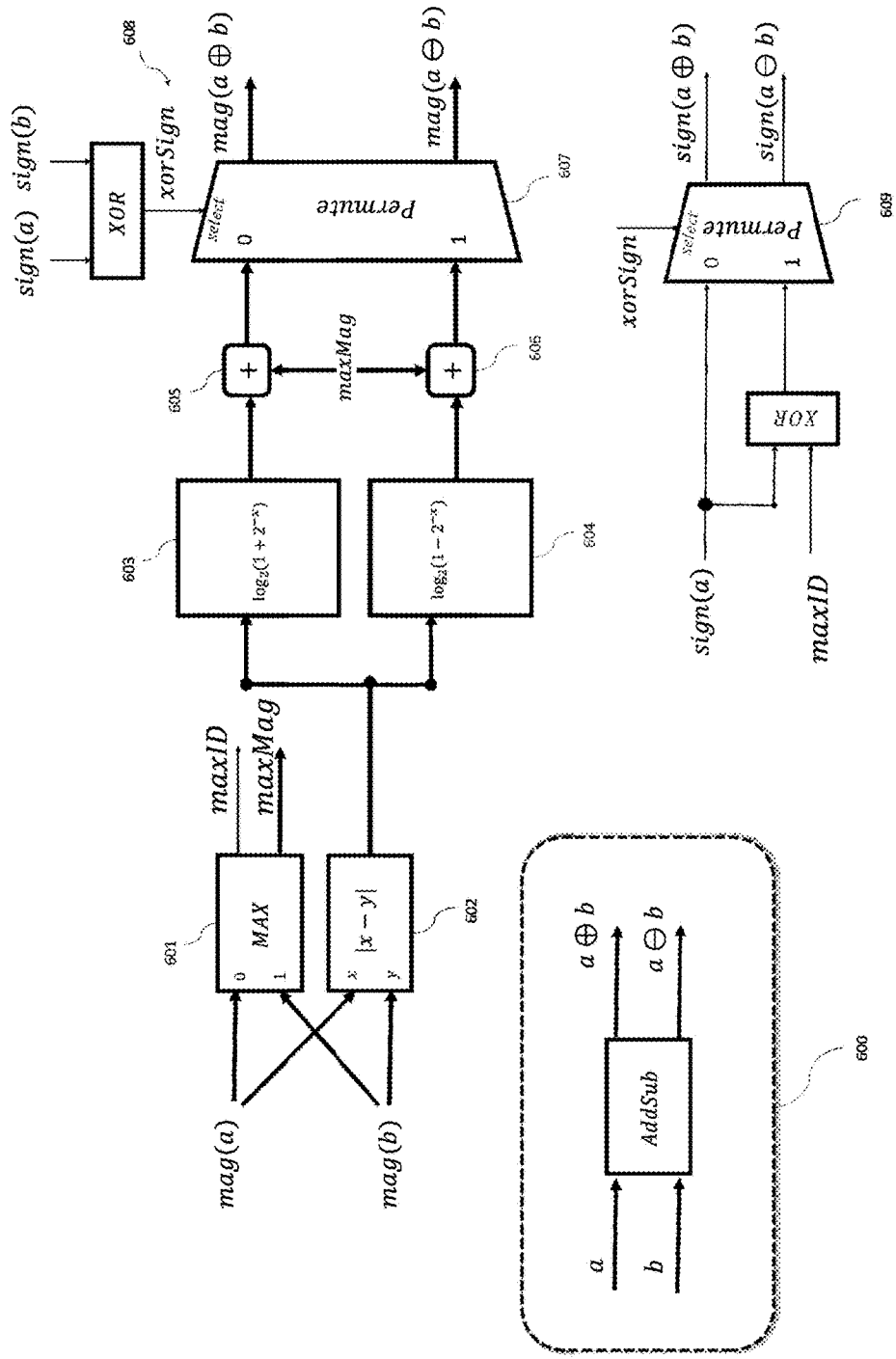
FIG. 6 schematically illustrates logical operations (e.g., software) or a circuit diagram (e.g., hardware) for performing operations $a \oplus b$ and $a \ominus b$ according to an embodiment of the invention.

One bottleneck of coset ML decoders is the coset likelihood calculations, e.g., equations (3), (6) and (7). In particular, the convolution operations in equation (5) are relatively complex and often delay decoding processes. Embodiments of the invention may reduce decoding complexity by, prior to processing, transforming the likelihoods from an initial domain to a transform domain to simplify the coset likelihood computations. For example, received likelihoods may be transformed into a transform domain where the convolution operations are replaced by much simpler multiplication operations, or a log transform domain where the convolution operations are replaced by much simpler addition operations, thereby decrease the computational complexity and increase decoding speed. Let $C^{(1)}$ and $C^{(2)}$ be two linear codes of length n over alphabet F, with dimensions $k_1$, $k_2$ such that $k_1>k_2$. Assume that $C^{(2)}$ is a subcode of $C^{(1)}$ and we would like to calculate the coset likelihoods in (3). Using the convolution method (direct method) requires $O(n \cdot |F|^{k_1})$ operations. On the other hand, using at least one embodiment of the invention requires $O((n+(k_1-k_2) \cdot \log(|F|)) \cdot |F|^{k_1-k_2})$. Computational efficiency may also be increased by a circuit that combines and reuses operations, e.g., ⊕ and ⊖ operations as shown in FIGS. 5-6.

Reference is made to FIG. 1A, which schematically illustrates a system comprising a maximum likelihood coset decoder operating according to an embodiment of the invention. The system may include one or more source transmitter(s) 110 and one or more receiver(s) 112. Transmitter(s) 110 and receiver(s) 112 may communicate wirelessly or via a wired connection. For wireless communication, transmitter(s) 110 and receiver(s) 112 may include one or more antenna(s) 114 and 116, respectively, for transmitting and/or receiving signals wirelessly over one or more communication channel(s). Receiver(s) 112 may receive one or more noisy error correction codeword(s) transmitted by source transmitter(s) 110 over wired or wireless communication channel(s) and may use a decoder 126 to decode the codeword(s) to reconstruct the transmitted signal.

Transmitter(s) 110 and receiver(s) 112 may include one or more controller(s) or processor(s) 118 and 120, respectively, configured for executing operations or computations disclosed herein and one or more memory unit(s) 122 and 124, respectively, configured for storing data such as inputs or outputs from each of the operations or computations and/or instructions (e.g., software) executable by a processor, for example for carrying out methods as disclosed herein. Processor(s) 120 may decode a noisy version of the codeword sent from transmitter(s) 110 by first transforming, from an initial domain to a transformed domain, one or more symbol probabilities that one or more individual symbols of the received error correction codeword were transmitted as one or more symbols in candidate transmitted error correction codewords. In the transformed domain, processor(s) 120 may compose a plurality of the transformed symbol probabilities to generate a combined coset probability defining the likelihood that the transmitted error correction codeword is associated with the individual symbols belongs to a particular one of a plurality of candidate cosets. The plurality of candidate cosets may be mutually exclusive subsets of a codebook defining all possible values of the error correction codeword. Processor(s) 120 may inverse transforming, from the transformed domain to the initial domain, a plurality of the coset probabilities for the plurality of respective cosets. Processor(s) 120 may use the plurality of the coset probabilities for ML coset decoding, sequential ML coset decoding, approximated ML codeword decoding, polar code decoding, or other operations.

Processor(s) 118 and 120 may include, for example, a central processing unit (CPU), a digital signal processor (DSP), a microprocessor, a controller, a chip, a microchip, an integrated circuit (IC), or any other suitable multi-purpose or specific processor or controller. Processor(s) 118 and 120 may individually or collectively be configured to carry out embodiments of a method according to the present invention by for example executing software or code. Memory unit(s) 122 and 124 may include, for example, random access memory (RAM), dynamic RAM (DRAM), flash memory, volatile memory, non-volatile memory, cache memory, buffers, registers, short term memory, long term memory, or other suitable memory units or storage units. Processor(s) 120 may be part of a general-purpose processor executing special-purpose decoding software or a special-purpose hardware unit that is a dedicated decoder 126.

Transmitter(s) 110 and receiver(s) 112 may include one or more input/output devices, such as a monitor, screen, speaker or audio player, for displaying, playing or outputting to users results provided by the decoder (e.g., data communicated by transmitter(s) 110 decoded by decoder 126) and an input device (e.g., such as a mouse, keyboard, touch-screen, microphone, or audio recorder) for example to record communication, control the operations of the system and/or provide user input or feedback, such as, selecting one or more encoding or decoding parameters, such as, decoding speed, decoding accuracy, a number or threshold number of iterations for a sequential decoder, a threshold size of a coset that may be used for codeword decoding, a threshold amount of time or duration allowable for coset decoding, codeword decoding, or total decoding, a threshold maximum time delay allowable between the time of receiving a signal and the time of decoding the signal, etc.

Reference is made to FIG. 1B, which schematically illustrates a memory system comprising a maximum likelihood coset decoder operating according to an embodiment of the invention. In various embodiments, the memory system may be a flash memory system or another memory system, such as, an electromechanical magnetic discs (e.g. hard disk drives), magnetic tapes and volatile electronic memories (e.g. SDRAM and DRAM), comprising an ECC encoder and decoder. While FIG. 1B illustrates a flash memory system, this system and its components may also be used for these other memory systems. Each of one or more components in FIG. 1B may use its own independent processor(s) or any combination of some or all components in FIG. 1B may use the same processor(s).

In FIG. 1B, host 150 may represent a client of a memory system, such as a flash memory system 156. Host 150 may run user applications 152 over an operating system 151. User applications 152 may communicate with memory system 156, for example, using low level drivers 153 that send commands to memory system 156 over a memory interface, such as a flash memory interface 154. Typical commands include commands to store user data in a specified memory location (e.g., identified by an address) and to retrieve user data from a specified memory location of memory system 156. Memory interface 154 may communicate with a memory controller, such as a flash memory controller 158, for example, using a host interface 160 over a memory bus 155.

Memory controller 158 performs the following tasks: (a) to provide the most suitable interface and protocol for both the host 150 and the memory system 156; (b) to efficiently handle data, maximize transfer speed, and maintain data integrity and information retention. In order to carry out such tasks, some embodiments of the invention implement an application specific device, for example, embedding one or more processor(s) (e.g. 176 and 180, usually 8-16 bits), together with dedicated hardware or software to handle timing-critical tasks. Generally speaking, memory controller 158 can be divided into multiple parts (e.g., parts 160, 162, 164 and 170), which are implemented either in hardware or in firmware.

Describing components of memory system 156 from top-to-bottom in FIG. 1B, the first component is host interface 160, which implements industry-standard protocol(s) (e.g., Peripheral Component Interconnect Express (PCIe), Serial Attached SCSI (SAS), Serial AT Attachment (SATA), etc.), thus ensuring both logical and electrical interoperability between memory system 156 (e.g., flash memory cards or Solid State Drives (SSDs)) and hosts 150. Host interface 160 may include a mixture of hardware (e.g., buffers, drivers, etc.) and firmware (e.g., permanent software executed by an embedded processor to perform functions such as command decoding, which may decode a command sequence invoked by host 150 and may handle the data flow to/from memory units or dies, such as a flash memory dies 174. The second component of memory system 156 in FIG. 1B is a (e.g., flash) translation layer 162 that translates between logical memory addresses used by host 150 and physical memory locations of the memory dies 174. Specifically, flash translation layer 162 may perform tasks, such as, wear leveling management, garbage collection and bad block management. Flash translation layer 162 may use general purpose processor(s) or dedicated processing hardware and internal memory to perform its tasks. The next component of memory system 156 in FIG. 1B is ECC unit 164, which includes both an ECC encoder 166 and ECC decoder 168. ECC encoder 166 encodes data by adding redundancy (ECC) to the data before storing the data in one of the memory dies 174 and also reads noisy or distorted versions of the codeword. ECC decoder 168 decodes or eliminates the noise from that codeword, thereby allow retrieval of the original data stored at the host 150. Memory controller 158 may communicate with physical memory dies 174 using an interface layer, such as a flash interface layer 170. Physical memory dies 174 may store data by altering the physical state of memory cells contained inside those dies. Commands and data may be sent between controller 158 and a plurality of memory dies 174 over a physical bus 172, also referred to as a "channel" 172. A single channel may include a plurality of memory dies 174, and interface layer 170 may include a plurality of (m) channels 172. Interface layer 170 may support access (e.g., storage and/or retrieval) to several channels simultaneously or in parallel. Such architectures of multiple dies 174 and/or multiple channels 172 may increase the read and program throughput, relative to a singular channel or singular die structure, which may also be used. In addition, memory controller 158 may include a plurality of ECC unit 164. Each one of ECC unit 164 may be dedicated for a set of one or more channels 172 (e.g., exclusively encoding/decoding data to/from memory dies 174 on only those dedicated channels 172). In other embodiments, ECC units 164 are not dedicated to any specific channel 172, and may decode/encode any codeword as it becomes available regardless of the memory destination or source of the codeword. In such a case, a controlling unit may route encode/decode requests between ECC units 164 and channels 172.

Memory controller 158 may include one or more controller(s) or processor(s) 176 and 180 for implementation of the ECC encoder 166 and the ECC decoder 168, respectively, configured for executing operations or computations disclosed herein and one or more memory unit(s) 178 and 182, respectively, configured for storing data such as inputs or outputs from each of the operations or computations and/or instructions (e.g., software) executable by a processor, for example for carrying out methods as disclosed herein. Processor(s) 180 may decode a noisy version of the codeword that was computed by the encoder processor 176 by first transforming, from an initial domain to a transformed domain, one or more symbol probabilities that one or more individual symbols of the received error correction codeword were programmed as one or more symbols in candidate programmed error correction codewords. In the transformed domain, processor(s) 180 may compose a plurality of the transformed symbol probabilities to generate a combined coset probability defining the likelihood that the transmitted error correction codeword is associated with the individual symbols belongs to a particular one of a plurality of candidate cosets. The plurality of candidate cosets may be mutually exclusive subsets of a codebook defining all possible values of the error correction codeword. Processor(s) 180 may inverse transform, from the transformed domain to the initial domain, a plurality of the coset probabilities for the plurality of respective cosets. Processor(s) 180 may use the plurality of the coset probabilities for ML coset decoding, sequential ML coset decoding, approximated ML codeword decoding, polar code decoding, or other operations.

Processor(s) 176 and 180 may include, for example, a central processing unit (CPU), a digital signal processor (DSP), a microprocessor, a controller, a chip, a microchip, an integrated circuit (IC), or any other suitable multi-purpose or specific processor or controller. Processor(s) 176 and 180 may individually or collectively be configured to carry out embodiments of a method according to the present invention by for example executing software or code. Memory unit(s) 178 and 182 may include, for example, random access memory (RAM), dynamic RAM (DRAM), flash memory, volatile memory, non-volatile memory, cache memory, buffers, registers, short term memory, long term memory, or other suitable memory units or storage units.

Figure 1C:
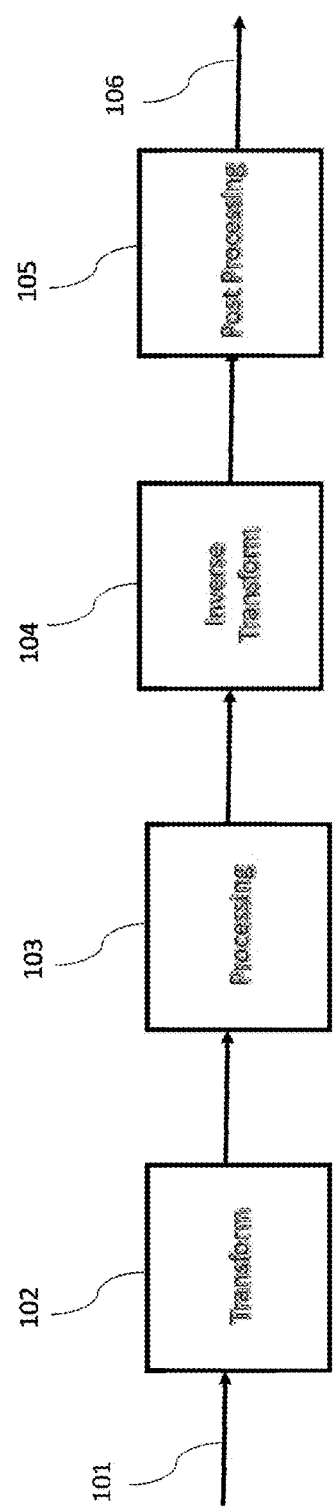
FIG. 1C is a flowchart of a method for performing coset maximum likelihood decoding using an internal transformation according to an embodiment of the invention.

Reference is made to FIG. 1C, which is a flowchart of a method for performing coset maximum likelihood decoding using an internal transformation according to an embodiment of the invention. Operations described herein may be executed using components or devices of FIG. 1A and/or FIG. 1B, for example, one or more receiver processor(s) 120 and/or decoder(s) 126 of FIG. 1A and/or one or more ECC decoder 168 processor(s) 180 of FIG. 1B or other devices.

In operation 101, one or more processor(s) may receive an input to the decoder, for example, one or more individual symbol probabilities measure the likelihoods that one or more individual symbols x of the transmitted error correction codeword $X_j$ were received as one or more symbols $y_j$ in the received noisy error correction codeword $Y_j$, or $y_0^{n-1}$ (also known as the channel observations vector), e.g., $Pr(Y_j=y_j|X_j=x)$ for each $x \in F$ and $0 \leq j \leq n-1$. Alternatively or additionally, the processor(s) may compute one or more log likelihoods, e.g., $\log_2(Pr(Y_j=y_j|X_j=x))$ or log-likelihood ratios $\log_2(Pr(Y_j=y_j|X_j=0))-\log_2(Pr(Y_j=y_j|X_j=x))$ for $x \in F \setminus \{0\}$. Let $C^{(1)}$ and $C^{(2)}$ be linear codes over field F of dimensions $k_1$, $k_2$ such that $k_1 > k_2$ and $C^{(2)}$ is a subcode of $C^{(1)}$.

In operation 102, one or more processor(s) may perform a transformation of the individual symbol probabilities, for example, to uniquely represent the likelihoods in a transformed space. The transformation may include an isomorphic transformation, a bijective transformation, a Fourier transform, a fast Fourier transform, a Hadamard transform, a fast Hadamard transform, etc. Other transformations may be used.

In operation 103, one or more processor(s) may compose the plurality of transformed individual symbols probabilities to generate a combined coset probability for each of a plurality of cosets of a code. Each coset probability may define a likelihood that the transmitted error correction codeword associated with the individual symbols belongs to a particular one of a plurality of candidate cosets. In one example, operation 103 may generate a plurality of $|F|^{k_1-k_2}$ coset probabilities, e.g., $\Sigma_{x_0^{n-1} \in A} Pr(Y_0^{n-1}=y_0^{n-1}|X_0^{n-1}=x_0^{n-1})$, for each coset A of $C^{(2)}$ in $C^{(1)}$. Alternatively or additionally, the output may be given, e.g., as $|F|^{k_1-k_2}$ log likelihoods or $|F|^{k_1-k_2}-1$ log-likelihood ratios. Operation 103 may repeat for a number of iterations using a sequential coset decoder to iteratively reduce the size of the coset. Composing the plurality of transformed individual symbols probabilities in the transformed space in operation 103 may convert the convolution operations used in the original domain (e.g., equation (10)) to multiplication and/or addition operations (e.g., equation (11) or its log-domain equivalent), thereby significantly reducing the total number of operations required for computing coset probabilities, as compared with processing in the original space.

In operation 104, one or more processor(s) may perform an inverse transformation on the plurality of coset probabilities for the plurality of respective cosets to generate the plurality of corresponding coset probabilities in the original domain.

In operation 105, one or more processor(s) may perform post processing on the inverse transformed data. Post processing is done to convert the output of the inverse transform to what is expected at the next stage. An example may be when the output on 106 is expected to be LLR. In one embodiment of the inverse transform outputs LLs and by appropriate normalization 105 converts it to LLRs. In other embodiments, other normalizations may be used for example to scale the output to a particular range such as a dynamic range.

In operation 106, the decoder may send the plurality of coset probabilities in the original domain, for example, via a wire, to a next operation or circuit that performs the next stage, such as, ML coset decoding (e.g., according to equation (3)), sequential ML coset decoding, ML codeword decoding (e.g., according to equation (2)), polar code decoding or other operations in order to complete the decoding operation.

According to some embodiments of the invention, multiple decoder circuits as described in reference to FIG. 1C may be coupled, e.g., in series, as a chain of decoder circuits or looped decoding operations. Moreover, outputs of multiple decoder circuits may be permuted or interleaved to generate a modified output to be passed as input to other circuits. The data output from operation 106 of a first process, processor or decoder, may be used as an input in operation 101 to a second process, processor or decoder (that may correspond to a different code than the first process). In an example in which the chain of circuits is used for decoding polar codes, each circuit may perform likelihood calculations on smaller sub-codes, referred to as kernels, within the polar codes, the results of which are then composed to decode the larger polar codes. The first circuit may skip the inverse transform operation 104 and perform the post-processing operation 105 and output operation 106 in the transform domain, and the second circuit may thus skip the transformation operation 102. Such a chain of circuits as described in reference to FIG. 1C may include a sequence of as many circuits as required. In one embodiment, only the final circuit or process in the chain may perform the inverse transformation 104. An example of an application for such a chain of decoders may be found, for example, in an intermediate step of likelihood calculations of successive cancellation algorithm operating on polar codes.

Reference is made to FIG. 2, which includes an example Hadamard transform and associated properties used according to an embodiment of the invention. Let p be a prime number and let the set [p]_ denote $\{0, 1, \ldots, p-1\}$. This set [p]_ may be a finite field under the operation of addition and multiplication, of p elements (modulo p), and is denoted GF(p). A function $f(b)$ 201 (e.g. symbol probability function $f(b)=Pr(Y=y|X\cdot h=b)$, where b, $h \in ([p]_-)^m$), may be defined from $([p]_-)^m$ (an m-length vector, where each index has a value between 0 and p-1)) to a field e.g., of complex numbers, $\mathbb{C}$. A Hadamard transformation $F(\omega)$ 202 may also be defined from $([p]_-)^m$ to $\mathbb{C}$. For vectors $\omega$ and b, $\omega \cdot b^T = \Sigma_{i=0}^{m-1} \omega_i \cdot b_i$, where multiplication and summation are defined as GF(p) operations. Property 204 is an orthogonality property, e.g., between functions $$e^{-\frac{2\pi i}{p}(\omega \cdot b^T)}$$

and $$e^{\frac{2\pi i}{p}(\omega \cdot b'^T)},$$

where $\omega$ may be the argument of the functions, b and b' may be constants, and $\delta_{x,y}=1$ if and only if x=y and otherwise $\delta_{x,y}=0$. Equation 205 may define an inverse transformation. Property 206 is a convolution property, e.g., if $g(\bullet)$ is a convolution of two functions $f_1(\bullet)$, $f_2(\bullet)$, then its Hadamard transform G is equal to multiplications of the Hadamard transforms of $f_1(\bullet)$, $f_2(\bullet)$. Property 207 is a composite function property defining that if $g(b)=f(b\cdot \Gamma)$, where $\Gamma$ is an invertible matrix of m rows and m columns over [p]_, then the Hadamard transform of $g(\bullet)$ equals $F(\omega \cdot (\Gamma^{-1})^T)$ where $F(\bullet)$ is the Hadamard transform of $f(\bullet)$. Note that the inverse of the matrix $\Gamma$ may be calculated over GF(p). Property 208 handles the case of a function g(b) where $g(b)=f(\tilde{b})$ if $b=\tilde{b}\cdot \Gamma$ where $\Gamma$ is a full rank matrix of l rows and m columns, b, $\omega$ are of length m and $\tilde{b}$ is of length l where ($l \leq m$). In other cases $g(b)=0$. The Hadamard transform of g may be equal in this case to $F(\omega \cdot \Gamma^T)$.

Further in accordance with at least one embodiment of the present invention, computation of the Hadamard transform and its inverse may be executed using a "fast Hadamard transform" (FHT) as shown in FIG. 3. The fast Hadamard transform is similar to the fast Fourier transform (FFT). Such fast transforms generally use on the order of $N \cdot \log(N)$ additions and multiplications, where $N=p^m$.

Reference is made to FIG. 3, which includes an example fast Hadamard transform (FHT) and associated properties used according to an embodiment of the invention. Equation 301 shows that the Hadamard transform of $f(b)$ may be presented as a linear combination of p Hadamard transforms of smaller sizes defined in 302. $F^{(b)}(\omega_1^{m-1})$ may be the Hadamard transform of $f^{(b)}(b_1^{m-1}) \triangleq f([b\ b_1^{m-1}])$ for $b \in [p]_-$. A closer look at this expression reveals that $F(\omega_0^{m-1})$ may be derived by a Hadamard transform of size p (denoted in equation 303 as $\mathcal{HT}$ operator) on the function $g(b) \triangleq F^{(b)}(\omega_1^{m-1})$.

Reference is made to FIG. 4, which includes an example transform operating over a binary field (p=2) for functions defined over the real numbers, $\mathbb{R}$, according to an embodiment of the invention. As such, equations 401-405 are a special case of equations 201-205, respectively. In the binary case, the transform, e.g., Hadamard transform, contains only additions and subtractions. The equations of FIG. 4 may be adapted to be performed in the log-domain. In the log-domain, input equation 401 may be replaced with $\log_2(f(b))$, and the decoder may compute the logarithm of its transform $\log_2(F(\omega))$. Signs should be accounted for when dealing with logarithms. As a consequence, logarithm results may be denoted, for example, by a two-tuple (sign, magnitude). If a denotes a logarithm number and $sign(a) \in \{0, 1\}$ and $mag(a) \in \mathbb{R}$, then $2^a \triangleq (-1)^{sign(a)} \cdot 2^{mag(a)}$.

Reference is made to FIG. 5, which schematically illustrates logical operations (e.g., software) or a circuit diagram (e.g., hardware) for performing operations $\oplus$ and $\ominus$ according to an embodiment of the invention. The $\oplus$ and $\ominus$ operators 502 and 501 respectively are defined in FIG. 5. The calculation of those operators may depend on the sign($\bullet$) of operands, a and b. In one example, $a \ominus b$ is calculated according to 503 if the operands have the same sign, e.g., sign(a)=sign(b); and otherwise is calculated according to 504. Conversely, in one example, $a \oplus b$ is calculated according to 504 if sign(a)=sign(b); and otherwise is calculated according to 503. When operating in the log domain, the $\oplus$ and $\ominus$ operators 502 and 501 may replace standard addition and subtraction operations, respectively, in the non-log or linear domain.

Reference is made to FIG. 6, which schematically illustrates logical operations (e.g., software) or a circuit diagram (e.g., hardware) for performing operations $a \oplus b$ and $a \ominus b$ according to an embodiment of the invention. The Hadamard transform may use both operations $a \oplus b$ and $a \ominus b$. FIG. 6 shows how these two operations may be computed simultaneously or in parallel, by reusing redundant calculations, to reduce the circuit computations by a factor of at least two. This circuit is denoted as AddSub 600.

In FIG. 6, thick lines may represent magnitude values in this circuit (see e.g. the inputs to the MAX circuit and the maxMag output in 601), whereas thin lines may represent lines that carry a single bit value (see e.g. the maxID output signal of the MAX circuit in 601). In an example operating in the log-domain, the circuit may receive as input two log representations of numbers a, b (e.g., represented by their magnitudes and signs, such as, mag(a), mag(b), sign(a), sign(b)). The circuit may simultaneously output the result of the both operations $a \oplus b$ and $a \ominus b$ (e.g., represented by their magnitudes and signs, such as, mag(a⊕b), mag(a⊖b), sign (a⊕b), sign(a⊖b)). Inputs e.g. mag(a) and mag(b) may be input into circuit block 601, which may output e.g. maxMag=max(mag(a), mag(b)) and maxID=0 if mag(a)= maxMag and maxID=1 otherwise. Inputs e.g. mag(a) and mag(b) may be input into circuit block 602, which may output e.g. |mag(a)−mag(b)|. Circuit block 602's output may be input into blocks 603 and 604 that outputs approximations of $\log_2(1+2^{-|mag(a)-mag(b)|})$ and $\log_2(1-2^{-|mag(a)-mag(b)|})$. Circuit blocks 603 and 604's outputs may be added to maxMag in circuit blocks 605 and 606, such that the output of circuit block 605 is e.g. approximately max (mag(a), mag(b))+$\log_2(1+2^{-|mag(a)-mag(b)|})$ and the output of circuit block 606 is e.g. approximately max(mag(a), mag (b))+$\log_2(1-2^{-|mag(a)-mag(b)|})$ Circuit blocks 605 and 606's two outputs may be input into Permute circuit block 607, which either leaves them in the same order if a select input 608 is null or zero (0); and otherwise it permutes or swaps them. In one embodiment, the select input 608 equals xorSign=xor(sign(a), sign(b)) and the permute circuit block 607 swaps the input values if and only if the signs of operands, a and b are different (not swapping the input values if the signs are the same).

Certain embodiments of the present invention may use a circuit as described in FIG. 6 to perform the log of the Hadamard transform for a field of size 2 for the binary case (e.g., for $f(b): \{0, 1\} \to \mathbb{R}$ as described in FIG. 4). In one example, this computation may also be equal to the log of the inverse Hadamard transform, e.g., up to an additive constant. Based on the recursive implementation of the fast Hadamard transform, a circuit implementing the Hadamard transform of $f(b): \{0, 1\}^m \to \mathbb{R}$ may perform m·$2^{m-1}$ iterations of the circuit of FIG. 6. Similarly, a circuit implementing the inverse Hadamard transform may perform the same number of iterations of the circuit of FIG. 6.

In some embodiments, a transmitter (e.g., transmitter 110 of FIG. 1A) may transmit one or more codewords $x \in ([p]_-)^n$ and a receiver (e.g., receiver 112 of FIG. 1A) may receive one or more channel observations vectors $y \in \mathbb{C}^n$ over a memoryless channel. In other embodiments, a memory controller (e.g., 158 of FIG. 1B) may program or store one or more codewords $x \in ([p]_-)^n$ in memory die(s) (e.g., 174 of FIG. 1B) and the same (or different) memory controller may read one or more channel observations vectors $y \in \mathbb{C}^n$ corresponding to the stored codewords. $C^{(1)}$ and $C^{(2)}$ may be two linear codes of length n over [p]_, with dimensions $k_1$, $k_2$ respectively, such that $C^{(2)} \subseteq C^{(1)}$ and $k_1 > k_2$. Let $H \in ([p]_-)^{(n-k_2) \times n}$ be the parity check matrix of $C^{(2)}$. The following n functions $g_j(s): ([p]_-)^{n-k_2} \to \mathbb{R}$, for $0 \leq j \leq n-1$ may define the symbol probabilities that one or more individual symbols b of the received or read error correction codeword X associated with codewords that have a syndrome s were received as one or more symbols $y_j$ in received noisy error correction codewords $Y_j$, for example, as.

$$g_j(s) = \begin{cases} Pr(Y_j = y_j | X = b) & s = (b \cdot H_j)^T \\ 0 & o.w. \end{cases} \quad (8).$$

In order to calculate the coset probabilities:

$$g(s) = \Sigma_{x \ s.t. \ Hx^T = s} \Pi_{j=0}^{n-1} Pr(Y_j = y_j | X = x_j) \quad (9),$$

the following convolution may be performed between the symbol probabilities $\{g_j(s)\}_{j=0, 1, 2, \ldots, n-1}$, e.g.:

$$g(s) = (g_0 * g_1 * g_2 * \ldots * g_{n-1})(s) \quad (10).$$

Embodiments of the present invention may also calculate a transform of symbol probabilities $g_j(s)$, denoted as $G_j(\omega)$, simplifying the convolution operation for the coset probability of (10) to the following multiplication operation in the transform space:

$$G(\omega) = G_0(\omega) G_1(\omega) G_2(\omega) \cdot \ldots \cdot G_{n-1}(\omega). \quad (11).$$

If operating in the log-transform space, the convolution operation of the coset probability of (10) would be simplified to an addition operation in the transform space:

$$\log_2(G(\omega)) = \log_2(G_0(\omega)) + \log_2(G_1(\omega)) + \log_2(G_2(\omega)) + \ldots + \log_2(G_{n-1}(\omega)).$$

The transform $G_j(\omega)$ may be computed (e.g., in operation 102 of FIG. 1C), for example, using property 208 of FIG. 2, where l=1, m=n−$k_2$, $\Gamma = (H_j)^T$ and $f_j(b) = Pr(Y = y_j | X = b)$. So for each transformed symbol probability $G_j(\omega)$, a Hadamard transform of size p may be calculated (e.g., the Hadamard transform of $f_j(b)$) and its values may be converted to $G_j(\omega)$ according to equation 208.

After the coset probability in equation (11), or its log-domain equivalent, is calculated, the inverse Hadamard transform may be computed for retrieving the coset probability g(s) corresponding to syndrome s in the initial domain (e.g., in operation 104 of FIG. 1C).

In some embodiments of the invention, $C^{(1)}$ may be a partial space or sub-space of the field with dimension, $k_1 < n$. In such cases, decoding over then entire space may provide an over-inclusive set of syndromes. In many cases, the subset of interesting syndromes S (e.g., representing cosets of $C^{(2)}$ in $C^{(1)}$) may be selected using, for example, the following condition:

$$\exists A \subseteq \{0, 1, \ldots n-k_2-1\}, |A| = n-k_2-(k_1-k_2) = n-k_1 \\ s.t. \forall s \in S, \ \forall i \in A, \ s_i = 0, \quad (12).$$

A subset of the indices of the syndromes, A, may be generated such that all the syndromes of $C^{(2)}$ in $C^{(1)}$ are zeros over these indices. It may be assumed that A={0, 1, . . . , n−$k_1$} without loss of generality. Accordingly, the coset probability g(s) may be computed for only the subset of A in which $s_0^{n-k_1-1} = 0$, for example, as:

$$g([0, s_{n-k_1}^{n-k_2-1}]) = \frac{1}{p^{k_1-k_2}} \cdot \sum_{\omega_{n-k_1}^{n-k_2-1} \in ([p]_-)^{k_1-k_2}} \tilde{G}(\omega_{n-k_1}^{n-k_2-1}) \cdot \exp\left(\frac{2\pi i}{p} \cdot \omega_{n-k_1}^{n-k_2-1} \cdot (s_{n-k_1}^{n-k_2-1})^T\right), \quad (13)$$

where, $$\tilde{G}(\omega_{n-k_1}^{n-k_2-1}) = \frac{1}{p^{n-k_1}} \sum_{\omega_0^{n-k_1-1} \in ([p]_-)^{n-k_1}} G([\omega_0^{n-k_1-1} \omega_{n-k_1}^{n-k_2-1}]) \quad (14)$$

$$\tilde{G}(\omega_{n-k_1}^{n-k_2-1}): ([p]_-)^{k_1-k_2} \to \mathbb{C}.$$

Figure 7:
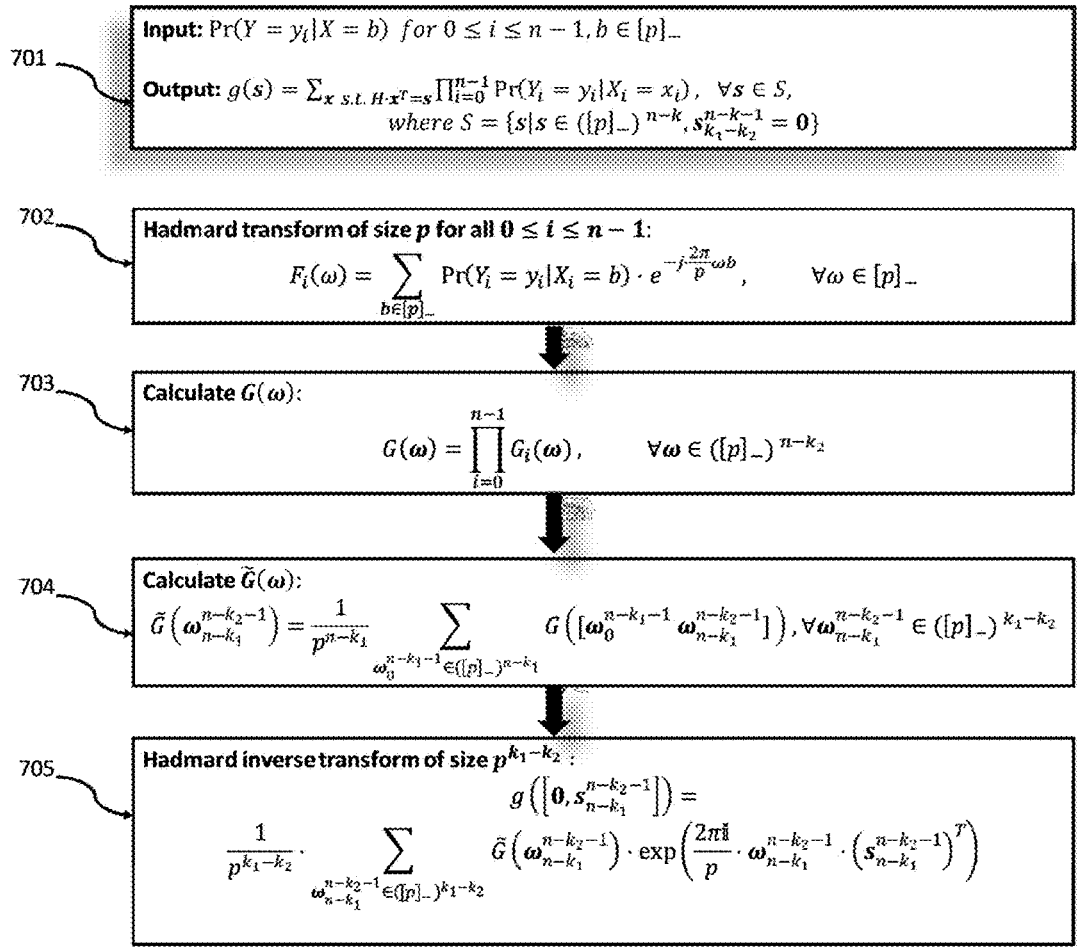
FIG. 7 is a flowchart of operations of a coset maximum likelihood decoder for codes over a field $GF(p)$ according to an embodiment of the invention.

Some embodiments may compute $\tilde{G}(\omega_{n-k_1}^{n-k_2-1})$ and then perform an inverse Hadamard transform of size $p^{k_1-k_2}$ as described in reference to FIG. 7.

Reference is made to FIG. 7, which is a flowchart of operations of a coset maximum likelihood decoder for codes over a field GF(p) according to an embodiment of the invention. Operation 701 defines as input likelihoods corresponding to the received channel vector y. Specifically, Pr(Y=$y_j$|X=b) may be the probability that the channel outcome is $y_j$ given that signal b was transmitted. Operation 701 further defines the output of operations 702-705, which are the likelihoods of cosets, corresponding to equation (9).

In operation 702, one or more processor(s) may perform a Hadamard transform on the input symbol probabilities, e.g., equation (8), to generate a Hadamard transform probabilities $F_j(\omega)$ of size p.

In operation 703, one or more processor(s) may compute the coset probabilities $G(\omega)$ based on those symbols e.g., defined by equation (11), in the transform domain. In one example, the processor(s) may compute $G_j(\omega)$ in 703 using property 208 in FIG. 2. $G(\omega)$ may be the transform of g(s) s∈$([p]\_)^{n-k_2}$. Since candidate cosets exists over a reduced subset space of syndromes S⊆$([p]\_)^{n-k_2}$, operation 704 may be executed to compute value of g(s) for only that reduced subset space.

In operation 704, one or more processor(s) may compute the coset probability for the subset space of syndromes $\tilde{G}(\omega_{n-k_1}^{n-k_2})$, e.g., defined by equation (14), in the transform domain. This computation may be used to reduce the complexity of the inverse transform used in operation 705.

In operation 705, one or more processor(s) may perform a Hadamard inverse transform, e.g., equation (13), of size $p^{k_1-k_2}$, to return the coset likelihoods to the initial domain.

Other operations or orders of operations may be executed.

Certain embodiments of the invention operate on extension fields of GF(p), e.g., GF($p^r$). In some embodiments, a transmitter (e.g., transmitter 110 of FIG. 1A) may transmit one or more codewords in the extension fields x∈(GF($p^r$))$^n$ and a receiver (e.g., receiver 112 of FIG. 1A) may receive one or more channel observations vectors y∈$\mathbb{C}^n$ over a memoryless channel. In other embodiments, a memory controller (e.g. 158 of FIG. 1B) may program or store one or more codewords in the extension fields x∈(GF($p^r$))$^n$ in memory die(s) (e.g., 174 of FIG. 1B) and the same (or different) memory controller may read one or more channel observations vectors y∈$\mathbb{C}^n$ corresponding to the stored codewords. $C^{(1)}$ and $C^{(2)}$ may be two linear codes in the extension fields (GF($p^r$))$^n$, of dimensions $k_1$, $k_2$ respectively, such that $C^{(2)} \subseteq C^{(1)}$ and $k_1 > k_2$. H∈(GF($p^r$))$^{(n-k_2) \times n}$ may be the parity check matrix of $C^{(2)}$. The following n functions $g_j(s)$: (GF($p^r$))$^{n-k_2} \to \mathbb{R}$, for 0≤j≤n−1 may be defined, for example, as:

$$g_j(s) = \begin{cases} Pr(Y_j = y_j | X = b) & s = (b \cdot H_j)^T \\ 0 & o.w. \end{cases} \quad (15)$$

Embodiments of the invention may reduce this problem to the GF(p) scenario, for example, using the observation that every code of length n over the extension field GF($p^r$) can be represented as a code of length n·r over the field GF(p). This representation may be defined such that for each codeword c∈GF($p^r$)$^n$, a matching codeword $\tilde{c}$∈GF(p)$^{rn}$ may be defined, such that $\tilde{c}_{j\cdot r}^{(j+1)\cdot r-1}$ is the Cartesian representation of $c_j$, for all 0≤j≤n−1.

An equivalent parity check matrix $\tilde{H}$∈(GF(p))$^{r(n-k_2) \times rn}$ may be defined such that for all codewords x∈GF($p^r$)$^n$, if the syndrome of x is x·$H^T$=s then $\tilde{x} \cdot \tilde{H}^T = \tilde{s}^T$, where $\tilde{x}$∈GF($p^r$)$^n$ is the GF(p) representation of x and $\tilde{s}$∈GF($p^r$)$^{(n-k_2)}$ is the GF(p) representation of the syndrome vector s. The operations performed over the extension field GF($p^r$) are shown, for example, in FIG. 8.

Figure 8:
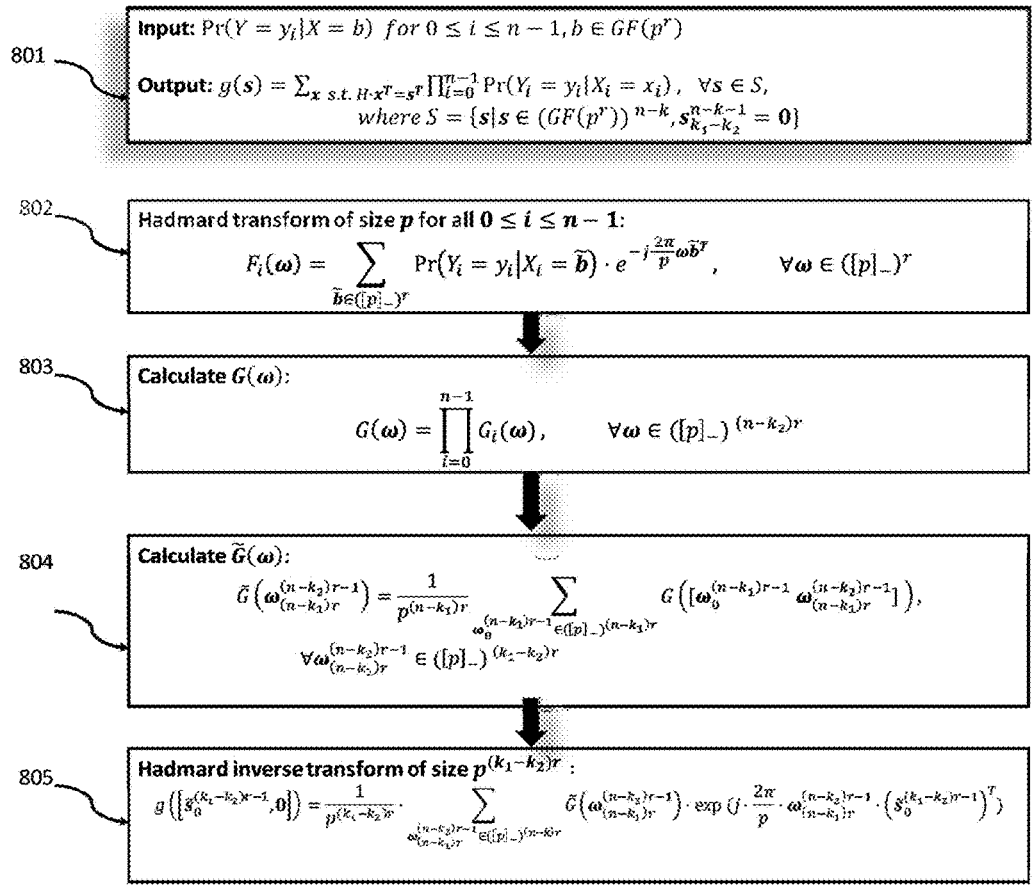
FIG. 8 is a flowchart of operations of a coset maximum likelihood decoder for codes over an extension field $GF(p^r)$ according to an embodiment of the invention.

Reference is made to FIG. 8, which is a flowchart of operations of a coset maximum likelihood decoder for codes over an extension field GF($p^r$) according to an embodiment of the invention. Operation 801 defines inputs to be likelihoods corresponding to the received channel vector y. Specifically, Pr(Y=$y_j$|X=b) is the probability that the channel outcome is $y_j$ given that signal b was transmitted. Operation 801 further defines the output of operations 802-805, which are the likelihoods of cosets, corresponding to equation (9).

In operation 802, one or more processor(s) may perform a Hadamard transform on the input, e.g., equation (15), to generate a Hadamard transform $F_j(\omega)$ of size $p^r$.

In operation 803, one or more processor(s) may compute equation (11) in the transform domain. In one example, the processor(s) may compute $G_j(\omega)$ in 803 using property 208 in FIG. 2, where l=r, m=(n−$k_2$)r, Γ=[$\tilde{H}_{jr}$, $\tilde{H}_{jr+1}$, . . . , $\tilde{H}_{(j+1)r-1}$] and $f(\tilde{b})$=Pr($Y_j=y_j|X=\tilde{b}$). A Hadamard transform of size $p^{n-k_2}$ may be calculated for each $G_j(\omega)$. $G(\omega)$ may be the transform of g(s) s∈$([p]\_)^{n-k_2}$. Since candidate codewords exist over a reduced subset space S⊆$([p]\_)^{n-k_2}$, operation 804 may be executed to compute value of g(s) for only that reduced subset space.

In operation 804, one or more processor(s) may compute equation (14) in the transform domain. This computation may be used to reduce the complexity of the inverse transform used in step 805.

In operation 805, one or more processor(s) may perform a Hadamard inverse transform, e.g., equation (13), of size $p^{(k_1-k_2)r}$.

Other operations or orders of operations may be executed.

Examples according to some embodiments of the present invention are described as follows.

Example I

Figure 9:
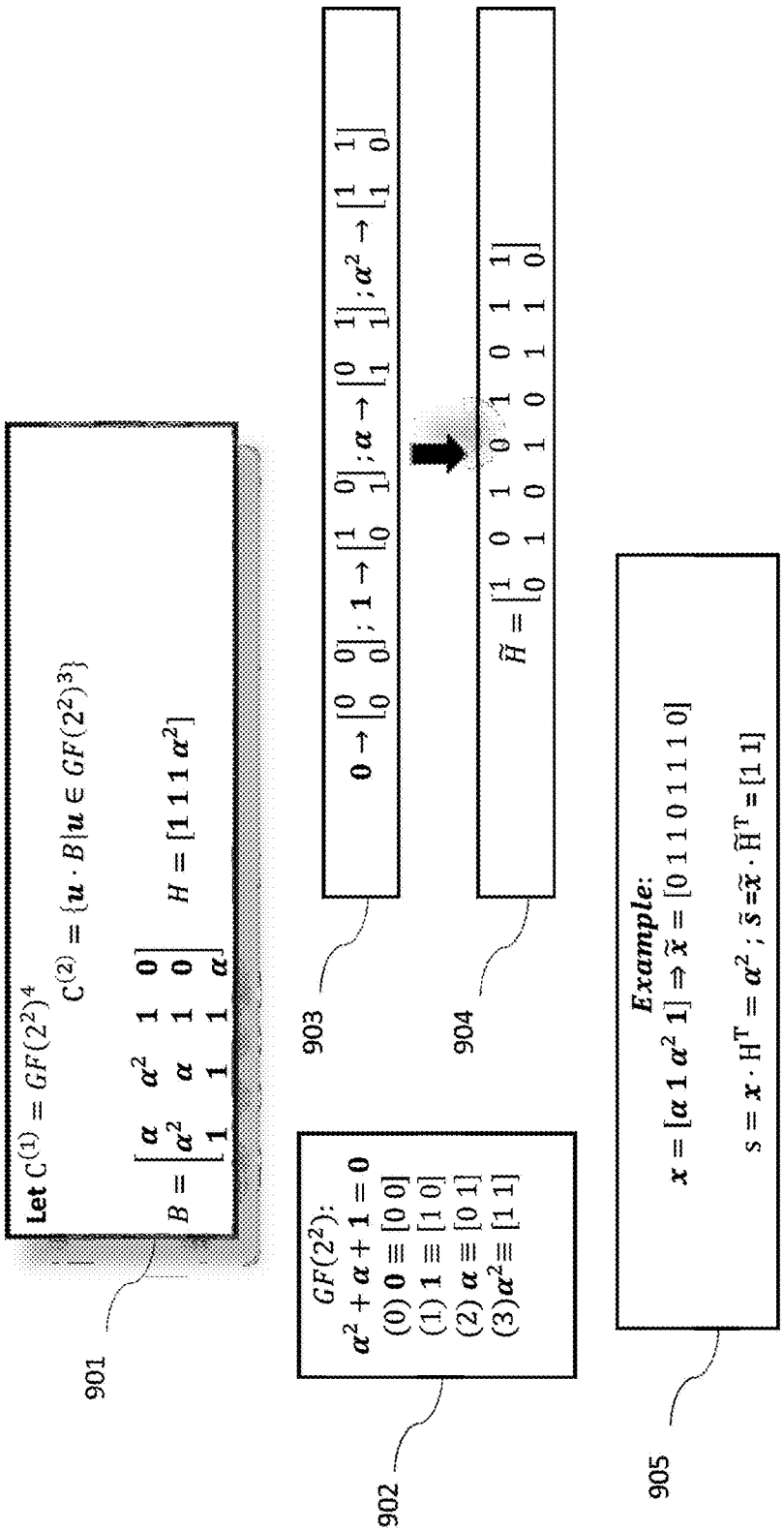
FIG. 9 defines codes used in Example I according to an embodiment of the invention.

Reference is made to FIG. 9, which defines codes used in Example I according to an embodiment of the invention. In 901, code $C^{(1)}$ may be defined as an entire space of vectors of length four over GF($2^2$). Accordingly, code $C^{(1)}$ has dimension, e.g., $k_1$=4. Code $C^{(2)}$ may be a sub-code of $C^{(1)}$ defining a subspace of GF($2^2$), e.g., having dimension $k_2$=3. Code $C^{(2)}$ may be defined by generating matrix B or, alternatively, by a parity-check matrix H.

In 902, the field GF($2^2$) may be defined using a zero of the primitive polynomial p(x)=$x^2$+x+1, which may be denoted as α. Consequently, in this example, there are four elements in the field (denoted by bold face fonts), 0, 1, α and $α^2$. These elements may also be represented in Cartesian form as binary two tuples, for example, [0 0], [1 0], [0 1] and [1 1], respectively. Each element in the field may be assigned a number, symbol, or other representative value, such as, ordinal numbers 0, 1, 2, 3, respectively, in round brackets in 902, for example, to simplify their representation.

904 provides an example conversion from parity-check matrix H into a binary matrix $\tilde{H}$∈{0, 1}$^{2 \times 8}$. The conversion may be performed by converting the elements in H into a 2×2 matrix according to 903. Vectors over GF($2^2$) may be converted to binary vectors by replacing each element in them by its binary Cartesian representation. In 905, an example is provided of a vector x∈GF($2^2$)$^4$ that is converted into a binary vector $\tilde{x}$ of length eight bits. Vector x belongs to a coset of $C^{(1)}$ having syndrome, e.g., s=x·$H^T$=$α^2$. Indeed, multiplying binary vector $\tilde{x}$ with $\tilde{H}^T$ generates syndrome $α^2$'s binary representation [1 1].

Figure 10:
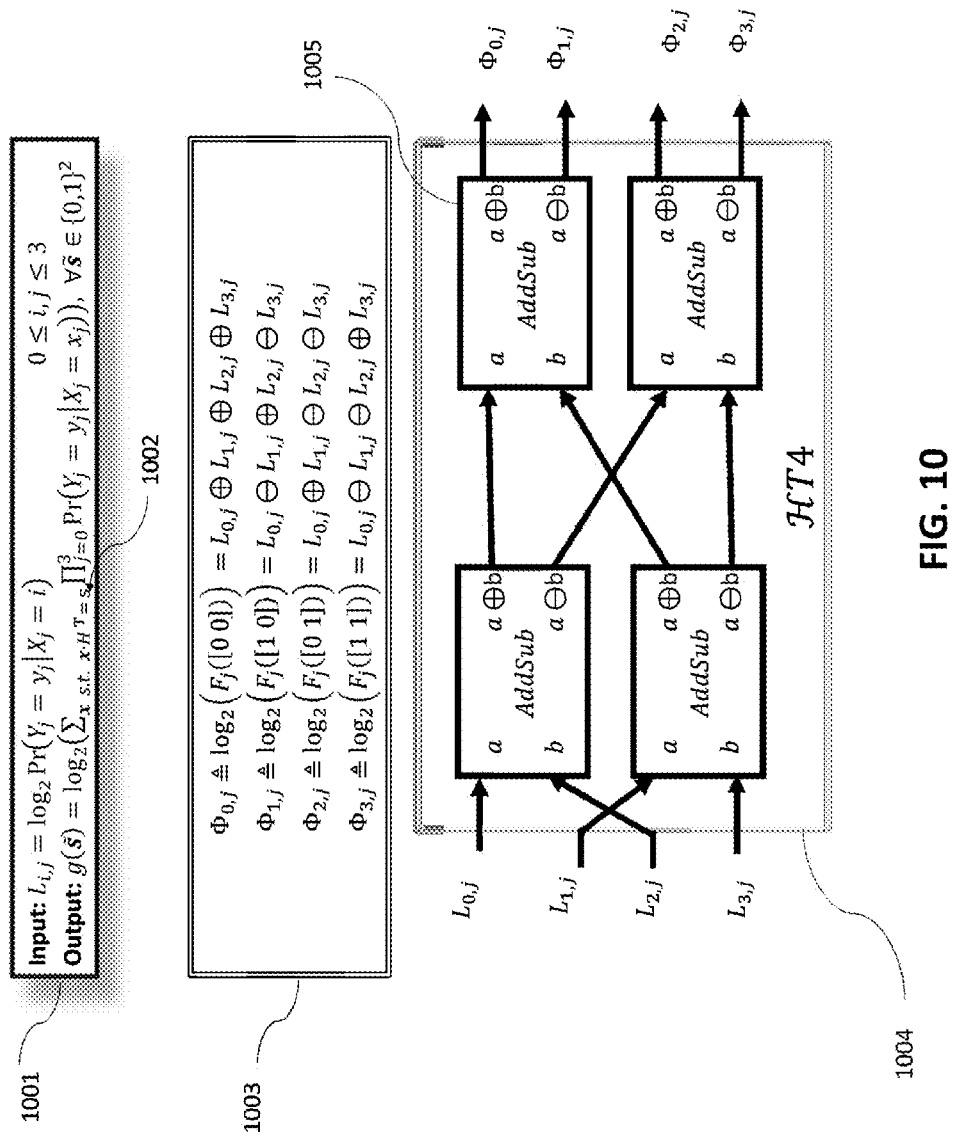
FIG. 10 provides a circuit to implement Example I according to an embodiment of the invention.

Reference is made to FIG. 10, which provides a circuit to implement Example I according to an embodiment of the invention. In FIG. 10, the circuit may be used to implement a fast Hadamard transform over the log domain, where the fast Hadamard transform has example size of four (4).

In 1001, an input is defined by log-likelihoods, e.g., $\log_2(\Pr(Y_j=y_j|X_j=i))$, where $y_j \in \mathbb{C}$ is a $j^{th}$ measurement received over a communication channel, and i is an ordinal notation of the field elements (e.g., specified in 902 in round brackets). An output may be the four values of g(s̃) that equal (e.g., up to a multiplicative constant) the log likelihoods of cosets of $C^{(2)}$. As shown in 1002, the summation (inside the logarithm) is performed over all vectors in the $GF(2^2)^4$ field having their syndrome equal to $s \in GF(2^2)$ which have a binary representation s̃ (the argument of the function). In 1003, the calculations of the Hadamard transform of size 4 are defined in terms of operations $\oplus$ and $\ominus$. Function $f_j(\tilde{b})=\Pr(Y=y_j|X_j=\tilde{b})$ is transformed to $F_j(\omega)$ where $\tilde{b}$ is the binary representation of b in $GF(2^2)$. In 1004, a fast Hadamard transform may be performed using AddSub circuits 1005, e.g., as specified in FIG. 6. The circuit is provided with inputs, a and b, represented by the sign magnitude representation, and generates outputs $a \oplus b$ and $a \ominus b$.

Figure 11:
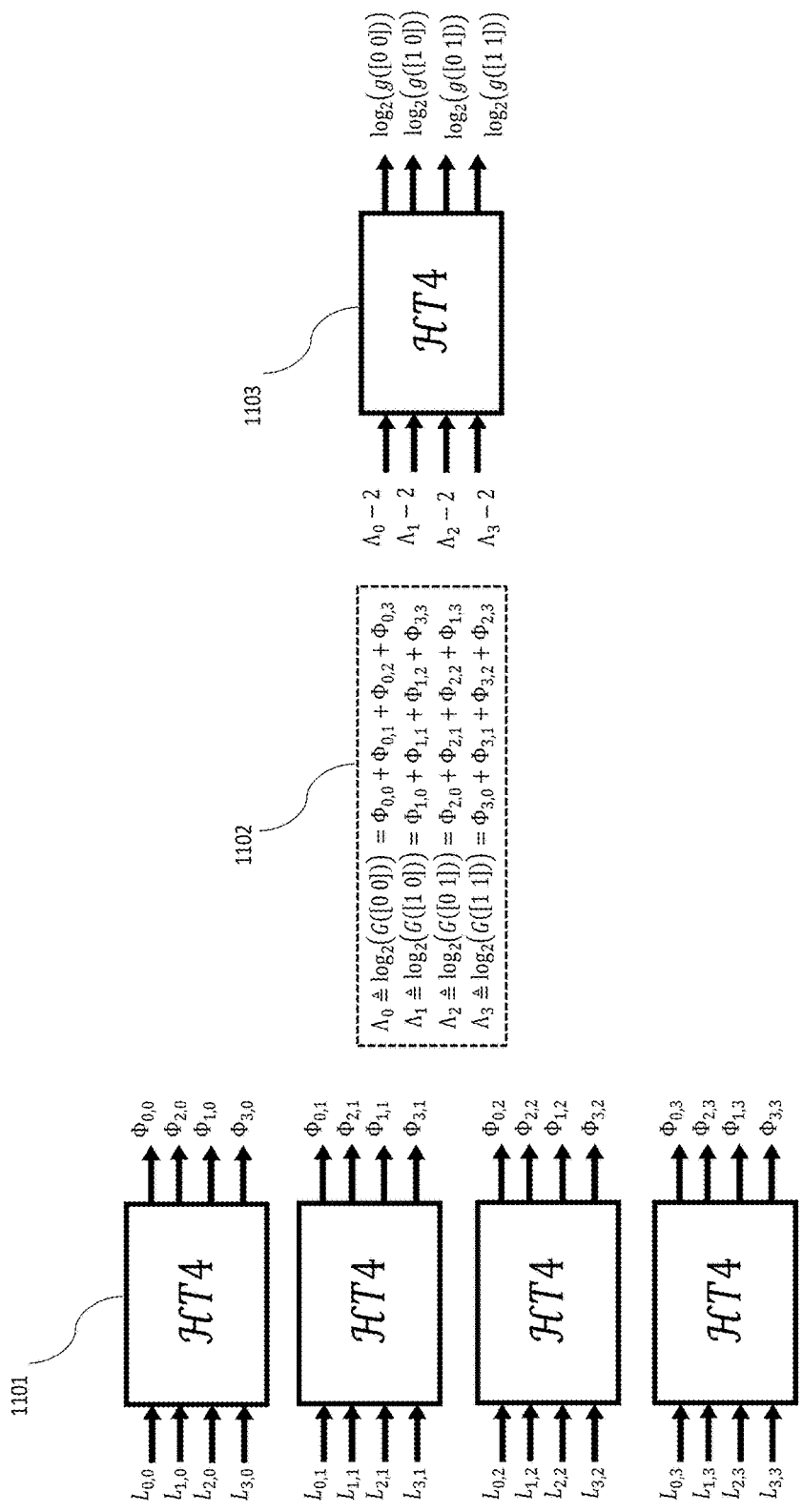
FIG. 11 schematically illustrates one or more circuits used to implement Example I defined in FIG. 10, using operations specified in FIG. 8, according to an embodiment of the invention.

Reference is made to FIG. 11, which schematically illustrates one or more circuits used to implement Example I defined in 1001, using operations specified in FIG. 8.

A first set of circuits 1101 may transform log-likelihoods $\{LL_{i,j}\}_{i=0, 1, 2, 3}$ to log of the Hadamard transforms, denoted for $\{\Phi_{i,j}\}_{i=0, 1, 2, 3}$ for j=0, 1, 2, 3 defined in 1003. The convolution property in an initial space in equation (4), simplified to a multiplication property in the transformed space in equation (11), may be implemented by additions in the log-domain transform space represented by 1102. The following may be computed according to property 208 of FIG. 2:

$$G(\psi) = F_0(\omega)F_1(\omega)F_2(\omega)F_3\left(\omega \cdot \begin{bmatrix} 1 & 1 \\ 1 & 0 \end{bmatrix}\right), \omega \in \{0, 1\}^2. \quad (16)$$

Operating in the log-domain, multiplications are replaced by additions, which may result in 1102. In the log-domain, addition of two numbers a and b, e.g., represented by their signs and magnitudes, may be performed according to the following formulae:

$a+b=c$ $\mathrm{mag}(c)=\mathrm{mag}(a)+\mathrm{mag}(b)$; $\mathrm{sign}(c)=\mathrm{xor}(\mathrm{sign}(a),\mathrm{sign}(b))$. (17)

Finally, in 1103, an inverse Hadamard transform may be performed. The inverse Hadamard transform may be performed, for example, by entering $\{\Lambda_i\}_{i=0, 1, 2, 3}$ elements subtracted by 2 (corresponding to dividing by 4 in the $\log_2(\bullet)$ domain).

Example II

Figure 12:
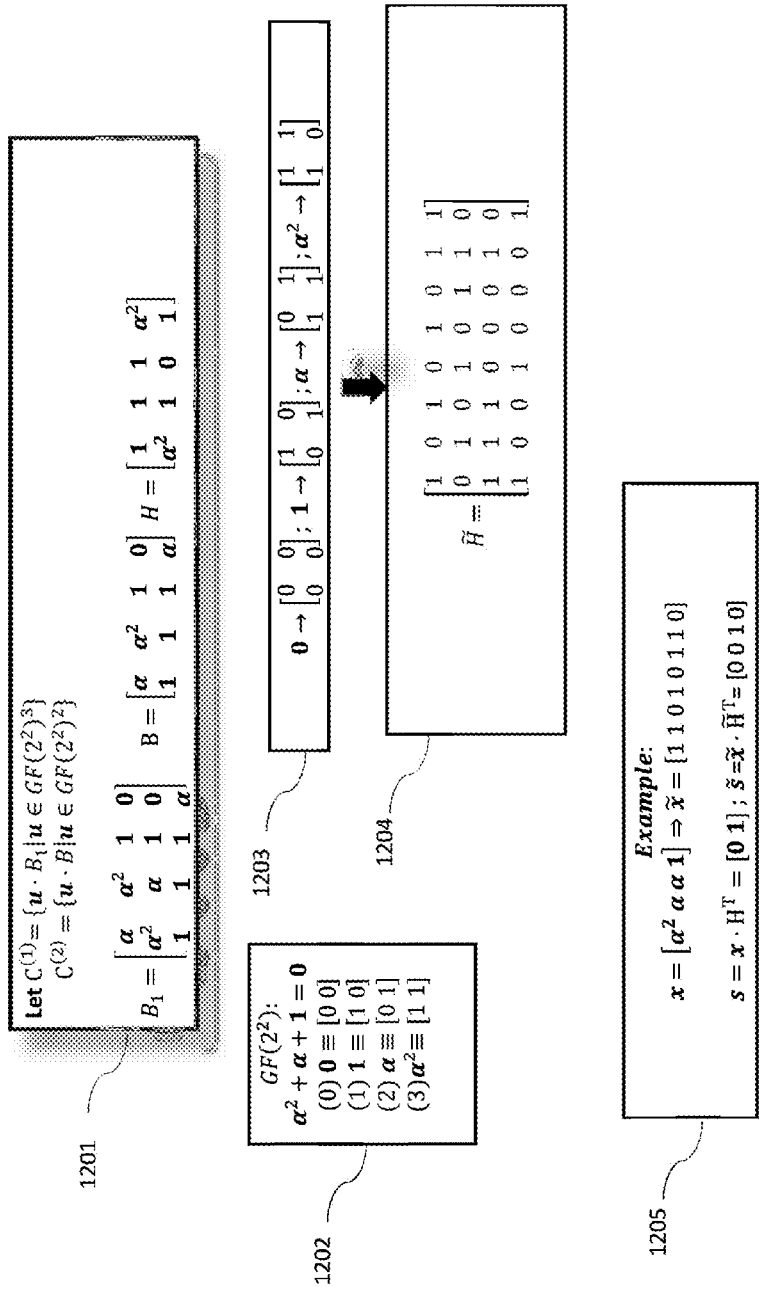
FIG. 12 defines codes used in Example II according to an embodiment of the invention.

Reference is made to FIG. 12, which defines codes used in Example II according to an embodiment of the invention. In 1201, codes $C^{(1)}$ may be defined as a linear space over $GF(2^2)$ of dimension $k_1=3$. Code $C^{(1)}$ may be defined by a generating matrix $B_1$. Code $C^{(2)}$ may be a sub-code of $C^{(1)}$ defining a subspace of dimension $k_2=2$. Code $C^{(2)}$ may be defined by a generating matrix B, or alternatively by a parity-check matrix H. Note that there are 4 cosets of $C^{(2)}$ in $C^{(1)}$.

In 1202, the field $GF(2^2)$ may be defined as in Example I (e.g., in 902 of FIG. 9). Substituting each field element in parity-check matrix H by a 2×2 binary matrix according to 1203 may result in a binary representation of the parity matrix in 1204, denoted by $\tilde{H}$. In 1205, an example is provided of a vector $x \in GF(2^2)^4$ that is converted to binary vector x̃ of length eight bits. Vector x belongs to a coset of $C^{(1)}$ having syndrome, e.g., $s=x \cdot H^T)=[0, 1]$. Indeed, multiplying binary vector x̃ with $\tilde{H}^T$ generates syndrome [0, 1]'s binary representation [0 0 1 0].

Figure 13:
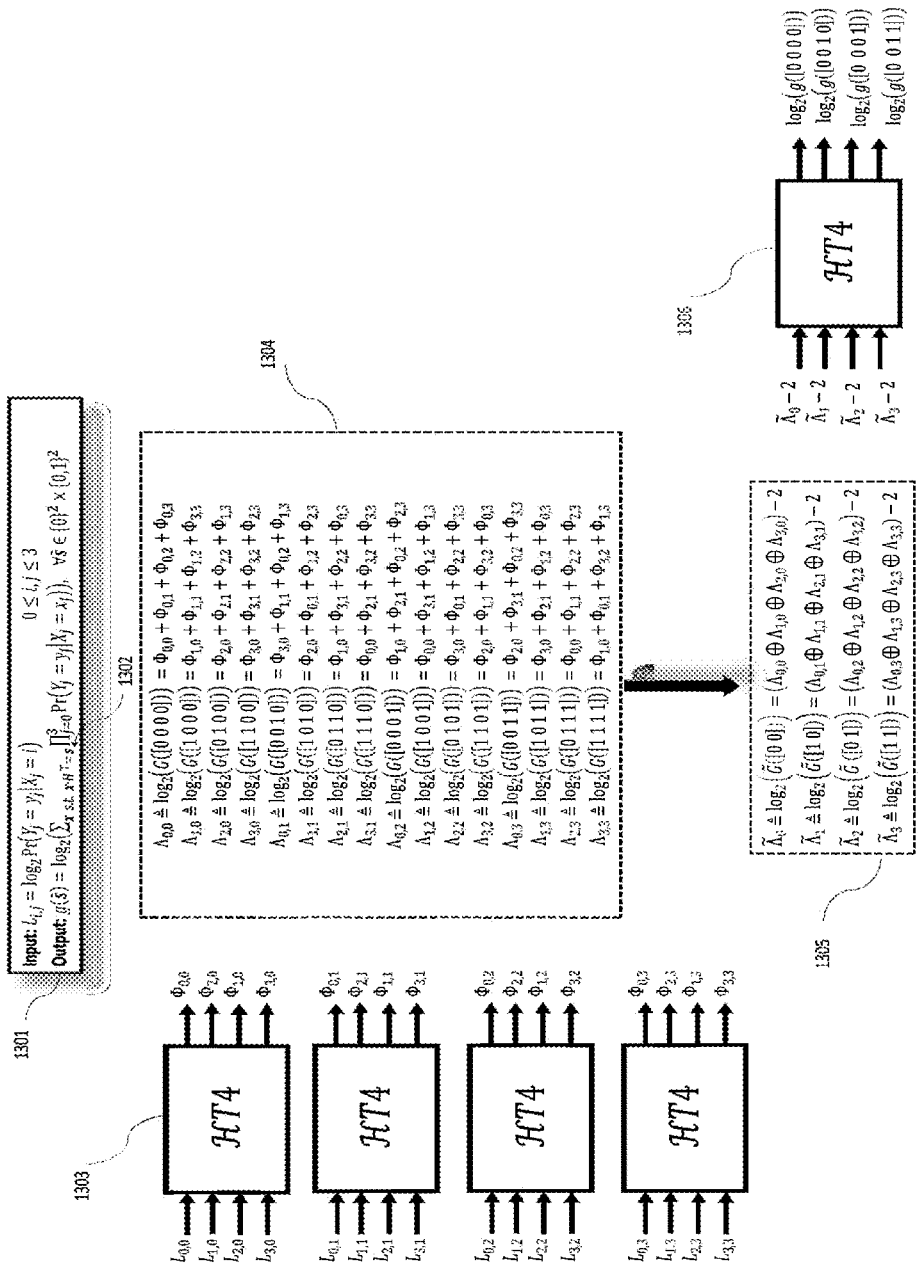
FIG. 13 schematically illustrates one or more circuits used to implement Example II according to an embodiment of the invention.

Reference is made to FIG. 13, which schematically illustrates one or more circuits used to implement Example II according to an embodiment of the invention.

In 1301, an input is defined by log-likelihoods $\log_2(\Pr(Y_j=y_j|X_j=i))$, where $y_j \in \mathbb{C}$ is a $j^{th}$ measurement received over a communication channel, and i is an ordinal notation of the field elements (e.g., specified in 1202 in round brackets). An output may be the four values of g(s̃) that equal (e.g., up to a multiplicative constant) the log likelihood of the cosets of $C^{(2)}$ in $C^{(1)}$. As shown in 1302, the summation (inside the logarithm) is performed over all vectors in $GF(2^2)^4$ having their syndrome equal to $s \in GF(2^2)^2$ that have a binary representation s̃ (the argument of the function). There are four possible cosets syndromes in $\{0\}^2 \times \{0, 1\}^2$, e.g., of the form $[0 \ 0 \ b_0 \ b_1]$, where $b_0, b_1 \in \{0, 1\}$. In 1303, a first set of circuits may transform log-likelihoods $\{LL_{i,j}\}_{i=0, 1, 2, 3}$ to $\{\Phi_{i,j}\}_{i=0, 1, 2, 3}$ for j=0, 1, 2, 3. Using the convolution property, e.g., equation (11), may be represented by an addition property in the log-domain transform space represented by 1304. The following may be computed according to property 208 of FIG. 2:

$$G(\omega)=F_0(\omega \cdot A_0)F_1(\omega \cdot A_1)F_2(\omega \cdot A_2)F_3(\omega \cdot A_3), \omega \in \{0,1\}^4, \quad (18)$$

where, $$A_0 = [\tilde{H}_0 \tilde{H}_1]^T = \begin{bmatrix} 1 & 0 & 1 & 1 \\ 0 & 1 & 1 & 0 \end{bmatrix}; \quad (19).$$

$$A_1 = [\tilde{H}_2 \tilde{H}_3]^T = \begin{bmatrix} 1 & 0 & 1 & 0 \\ 0 & 1 & 0 & 1 \end{bmatrix};$$

$$A_2 = [\tilde{H}_4 \tilde{H}_5]^T = \begin{bmatrix} 1 & 0 & 0 & 0 \\ 0 & 1 & 0 & 0 \end{bmatrix};$$

$$A_3 = [\tilde{H}_6 \tilde{H}_7]^T = \begin{bmatrix} 1 & 1 & 1 & 0 \\ 1 & 0 & 0 & 1 \end{bmatrix}.$$

Operating in the log-domain, multiplications are replaced by additions, which may result in 1304. Performing the inverse Hadamard transform on all 16 values of $\Lambda_{i,j}$ may result in the log-likelihood of all of the cosets of $C^{(2)}$ in $GF(2^2)^4$. The set of candidate values may be reduced to a subset of interesting syndromes S, e.g., representing four cosets in $C^{(1)}$. As a consequence, operation 804 from FIG. 8 may be performed in 1305. In 1306, the inverse Hadamard transform may be performed, for example, by entering $\{\tilde{\Lambda}_i\}_{i=0, 1, 2, 3}$ elements subtracted by 2 (corresponding to dividing by 4 in the $\log_2(\bullet)$ domain).

Figure 14:
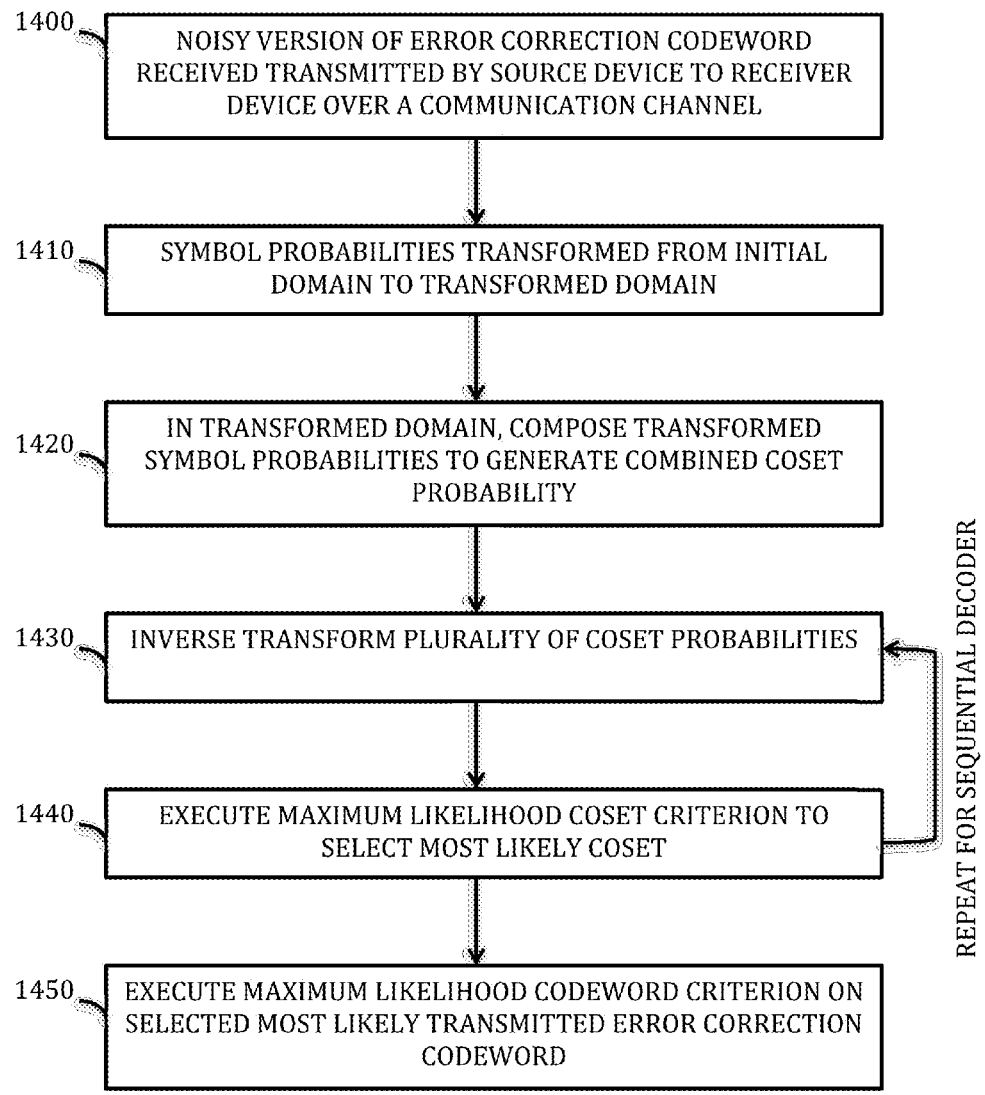
FIG. 14 is a flowchart of a method for operating a coset maximum likelihood decoder according to an embodiment of the invention.

Reference is made to FIG. 14, which is a flowchart of a method for operating a coset maximum likelihood decoder according to an embodiment of the invention. Operations described in reference to FIG. 14 may be performed using devices, for example, described in reference to FIG. 1A or FIG. 1B, although other systems and devices may be used. In one example, operations 1400-1450 may be performed using one or more receiver processor(s) 120 of FIG. 1A. In another example, operations 1400-1450 may be performed using one or more ECC decoder processor(s) 180 of FIG. 1B.

In operation 1400, one or more processor(s) (e.g., receiver processor(s) 120 of FIG. 1A) may receive a noisy version of an error correction codeword that has been transmitted by a source device (e.g., transmitter 110 of FIG. 1A) to a receiver device (e.g., receiver 112 of FIG. 1A) over a communication channel. In another embodiment, in operation 1400, one or more processor(s) (e.g., memory controller decoder processor(s) 180 of FIG. 1B) may receive a noisy version of an error correction codeword that was previously programmed into memory die(s) (e.g., 174 of FIG. 1B) by a memory controller (e.g., 158 of FIG. 1B) using an ECC encoder processor (e.g. 176 of FIG. 1B).

In operation 1410, the processor(s) may transform one or more symbol probabilities (e.g., equation (1)) from an initial domain to a transformed domain. The symbol probabilities may measure the likelihood that one or more individual symbols of the received error correction codeword were transmitted as one or more symbols in candidate transmitted error correction codewords. The processor(s) may receive or compute those symbol probabilities. The transformation may be an isomorphism, a bijection, a Fourier transform, a fast Fourier transform, a Hadamard transform, a fast Hadamard transform, or any transform in which a convolution operation in the original domain is simplified in the transform domain. In dome embodiments, the transformed domain may be a log domain and the plurality of coset probabilities in operation 1420 may be computed based on log likelihoods.

In operation 1420, in the transformed domain, the processor(s) may compose a plurality of the transformed symbol probabilities (e.g., as in equation (11) or its log-domain equivalent) to generate a combined coset probability defining the likelihood that the transmitted error correction codeword is associated with the individual symbols belongs to a particular one of a plurality of candidate cosets. The plurality of candidate cosets may be mutually exclusive subsets of a codebook defining all possible values of the error correction codeword. The coset probabilities may be generated for each coset by combining the individual symbol probabilities associated with codewords that have a syndrome associated with the coset. In some embodiments, a reduced subset space of syndrome subset may be considered and the coset probabilities may be generated for the subset space of syndromes. The coset probabilities may be generated in the transformed domain using multiplication or addition computations representing convolution computations in the initial domain. These coset probabilities may be generated using fewer computations than would be used in the initial domain. In one embodiment, the number of computations may be reduced from an order of $n \cdot |F|^{k_1}$ computations in the initial domain to an order of $n + (k_1 - k_2) \cdot \log(|F|) \cdot |F|^{k_1 - k_2}$ computations in the transformed domain, where n is the code length, $|F|$ is the size of the alphabet, and $k_1$, $k_2$ are the dimensions of a code and a coset of the code. Such a reduction may decrease the duration of time used to generate coset probabilities and/or thus decode codewords, reduce memory and processing power designated for generating coset probabilities and storing intermediate results, and thereby increase and improve decoding performance and speed.

In one embodiment, the processor(s) may execute multiple decoder circuits, in series, wherein the output of a first of the multiple decoder circuits is sent in the transformed domain, without inverse transforming the output, to a second of the multiple decoder circuits. The multiple decoder circuits may be used to decode a polar code, wherein the multiple decoder circuits generate multiple coset probabilities for multiple kernels of the polar code, respectively, and the processor(s) combine the multiple coset probabilities to generate a combined coset probability for the entire polar code.

In operation 1430, the processor(s) may inverse transform a plurality of coset probabilities for the plurality of respective cosets from the transformed domain to the initial domain.

In operation 1440, in the initial domain, the processor(s) may execute a maximum likelihood coset criterion (e.g., as in equation (3)) to select the candidate coset that has a maximum one of the plurality of coset probabilities. Operation 1440 may reduce the set of the plurality of candidate cosets to a most likely coset in which the transmitted error correction codeword most likely belongs. Operation 1440 may repeat or iterate for a plurality of iterations to execute a sequential coset decoder. A sequential coset decoder may iteratively execute the maximum likelihood coset criterion. In each current iteration, the sequential coset decoder selects a most likely coset of the coset selected in the previous iteration, wherein the most likely coset of the current iteration has a smaller number of candidate error correction codewords than the most likely coset of the previous iteration. The sequential coset decoder may iterate a number of times, for example, until the number of candidate error correction codewords in a final coset generated in a final iteration is below a threshold number and/or until a duration of time estimated for decoding the candidate error correction codewords in a final coset generated in a final iteration is below a threshold duration of time.

In operation 1450, after selecting a final most likely coset, the processor(s) may execute a maximum likelihood codeword criterion on the selected coset in order to determine a most likely transmitted error correction codeword in the coset selected in operation 1440 that has a maximum likelihood.

Other operations or orders of operations may be used.

In accordance with an embodiment of present invention, executed "in parallel" as used herein may refer to executed substantially concurrently, simultaneously, or during completely or partially overlapping time intervals. For example, operations a⊕b and a⊖b may be executed in parallel as shown in FIG. 6. Executed "in series" as used herein may refer to executed sequentially, one-after-another or at substantially different, non-concurrently, or completely or partially non-overlapping time intervals. For example, each of multiple circuits or iterations of a sequential coset decoder may be executed in series.

In the foregoing description, various aspects of the present invention have been described. For purposes of explanation, specific configurations and details are set forth in order to provide a thorough understanding of the present invention. However, it will also be apparent to a person of ordinary skill in the art that the present invention may be practiced without the specific details presented herein. Furthermore, well-known features may be omitted or simplified in order not to obscure the present invention.

Unless specifically stated otherwise, as apparent from the foregoing discussions, it is appreciated that throughout the specification discussions utilizing terms such as "processing," "computing," "calculating," "determining," or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

In accordance with any of the aforementioned embodiments of the invention, systems and methods may be software-implemented using dedicated instruction(s) or, alternatively, hardware-implemented using designated circuitry and/or logic arrays.

In accordance with any of the aforementioned embodiments of the invention, systems and methods may be executed using an article such as a computer or processor readable non-transitory storage medium, or a computer or processor storage medium, such as for example a memory (e.g. one or more memory unit(s) 122 and 124 of FIG. 1A or 178 and 182 of FIG. 1B), a disk drive, or a flash memory, for encoding, including or storing instructions which when executed by a processor or controller (e.g., one or more controller(s) or processor(s) 118 and 120 of FIG. 1A or 176 and 180 of FIG. 1B), carry out methods disclosed herein.

Different embodiments are disclosed herein. Features of certain embodiments may be combined with features of other embodiments; thus certain embodiments may be combinations of features of multiple embodiments.

Although the particular embodiments shown and described above will prove to be useful for the many distribution systems to which the present invention pertains, further modifications of the present invention will occur to persons skilled in the art. All such modifications are deemed to be within the scope and spirit of the present invention as defined by the appended claims.

The invention claimed is:

1. A method for decoding, the method comprising:
receiving a noisy version of an error correction codeword;
transforming, from an initial domain to a transformed domain, one or more symbol probabilities that one or more individual symbols of the received error correction codeword were transmitted as one or more symbols in candidate transmitted error correction codewords;
in the transformed domain, composing a plurality of the transformed symbol probabilities to generate a combined coset probability defining the likelihood that the transmitted error correction codeword is associated with the individual symbols belongs to a particular one of a plurality of candidate cosets, wherein the plurality of candidate cosets are mutually exclusive subsets of a codebook defining all possible values of the error correction codeword; and
inverse transforming, from the transformed domain to the initial domain, a plurality of the coset probabilities for the plurality of respective cosets.

2. The method of claim 1 comprising receiving the noisy version of an error correction codeword transmitted by a source device to a receiver device over a communication channel.

3. The method of claim 1 comprising reading the noisy version of an error correction codeword previously stored in a memory device by a memory controller.

4. The method of claim 3, wherein the memory device is a flash memory device.

5. The method of claim 1 comprising, in the initial domain, executing a maximum likelihood coset criterion to select the candidate coset that has a maximum one of the plurality of coset probabilities to reduce the set of the plurality of candidate cosets to a most likely coset in which the transmitted error correction codeword most likely belongs.

6. The method of claim 1 comprising executing a sequential coset decoder to iteratively execute the maximum likelihood coset criterion, wherein, in each current iteration, the sequential coset decoder selects a most likely coset of the coset selected in the previous iteration, wherein the most likely coset of the current iteration has a smaller number of candidate error correction codewords than the most likely coset of the previous iteration.

7. The method of claim 6 comprising executing the sequential coset decoder a number of iterations until the number of candidate error correction codewords in a final coset generated in a final iteration is below a threshold number.

8. The method of claim 6 comprising executing the sequential coset decoder a number of iterations until a duration of time estimated for decoding the candidate error correction codewords in a final coset generated in a final iteration is below a threshold duration of time.

9. The method of claim 1 comprising executing a maximum likelihood codeword criterion on the selected coset in order to determine a most likely transmitted error correction codeword in the most likely coset that has a maximum likelihood codeword criteria value.

10. The method of claim 1 comprising executing multiple decoder circuits, in series, wherein the output of a first of the multiple decoder circuits is sent in the transformed domain, without inverse transforming the output, to a second of the multiple decoder circuits.

11. The method of claim 10 comprising decoding a polar code, wherein the multiple decoder circuits generate multiple coset probabilities for multiple kernels of the polar code, respectively, and combining the multiple coset probabilities to generate a combined coset probability for the entire polar code.

12. The method of claim 1, wherein the coset probabilities are generated for coset by combining the individual symbol probabilities associated with codewords that have a syndrome associated with the coset.

13. The method of claim 12, wherein the coset probabilities are generated for a subset space of syndromes.

14. The method of claim 1, wherein the coset probabilities are generated in the transformed domain using fewer computations than would be used in the initial domain.

15. The method of claim 14 comprising reducing the number of computations from an order of at most $n \cdot |F|^{k_1}$ computations in the initial domain to an order of at most $n + (k_1 - k_2) \cdot \log(|F|)) \cdot |F|^{k_1 - k_2}$ computations in the transformed domain, where n is the code length, $|F|$ is the size of the alphabet, and $k_1$, $k_2$ are the dimensions of a code and a coset of the code.

16. The method of claim 1, wherein the transformed symbol probabilities are composed in the transformed domain using multiplication or addition computations representing convolution computations in the initial domain.

17. The method of claim 1, wherein the transforming is performed using a Hadamard transform.

18. The method of claim 1, wherein the transformed domain is a log domain and the plurality of coset probabilities are computed based on log likelihoods.

19. A device comprising:
one or more memories to store a noisy version of an error correction codeword; and
one or more processors to:
transform, from an initial domain to a transformed domain, one or more symbol probabilities that one or more individual symbols of the received error correction codeword were transmitted as one or more symbols in candidate transmitted error correction codewords;

in the transformed domain, compose a plurality of the transformed symbol probabilities to generate a combined coset probability defining the likelihood that the transmitted error correction codeword is associated with the individual symbols belongs to a particular one of a plurality of candidate cosets, wherein the plurality of candidate cosets are mutually exclusive subsets of a codebook defining all possible values of the error correction codeword, inverse transform, from the transformed domain to the initial domain, a plurality of the coset probabilities for the plurality of respective cosets.

20. The device of claim 19 comprising a receiver device for receiving the noisy version of an error correction codeword transmitted by a source device over a communication channel.

21. The device of claim 19 comprising a memory device including a memory controller, wherein the one or more processors read the noisy version of an error correction codeword previously stored in the memory device by the memory controller.

22. The device of claim 21, wherein the memory device is a flash memory device.

23. The device of claim 19, wherein the processors are configured to, in the initial domain, execute a maximum likelihood coset criterion to select the candidate coset that has a maximum one of the plurality of coset probabilities to reduce the set of the plurality of candidate cosets to a most likely coset in which the transmitted error correction codeword most likely belongs.

24. The device of claim 19, wherein the processors are configured to execute a sequential coset decoder to iteratively execute the maximum likelihood coset criterion, wherein, in each current iteration, the sequential coset decoder selects a most likely coset of the coset selected in the previous iteration, wherein the most likely coset of the current iteration has a smaller number of candidate error correction codewords than the most likely coset of the previous iteration.

25. The device of claim 19, wherein the processors are configured to execute a maximum likelihood codeword criterion on the selected coset in order to determine a most likely transmitted error correction codeword in the most likely coset that has a maximum likelihood codeword criteria value.

26. A non-transitory computer readable medium comprising instructions which when implemented on one or more processors in a maximum likelihood coset decoder cause the decoder to:

receive a noisy version of an error correction codeword;

transform, from an initial domain to a transformed domain, one or more symbol probabilities that one or more individual symbols of the received error correction codeword were transmitted as one or more symbols in candidate transmitted error correction codewords;

in the transformed domain, compose a plurality of the transformed symbol probabilities to generate a combined coset probability defining the likelihood that the transmitted error correction codeword is associated with the individual symbols belongs to a particular one of a plurality of candidate cosets, wherein the plurality of candidate cosets are mutually exclusive subsets of a codebook defining all possible values of the error correction codeword; and inverse transform, from the transformed domain to the initial domain, a plurality of the coset probabilities for the plurality of respective cosets.

* * * * *